(12) United States Patent
Oonishi et al.

(10) Patent No.: US 8,779,586 B2
(45) Date of Patent: Jul. 15, 2014

(54) DIE BOND FILM, DICING DIE BOND FILM, AND SEMICONDUCTOR DEVICE

(75) Inventors: Kenji Oonishi, Ibaraki (JP); Miki Hayashi, Ibaraki (JP); Kouichi Inoue, Ibaraki (JP); Yuichiro Shishido, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 457 days.

(21) Appl. No.: 13/036,277

(22) Filed: Feb. 28, 2011

(65) Prior Publication Data

US 2011/0210455 A1    Sep. 1, 2011

(30) Foreign Application Priority Data

Mar. 1, 2010    (JP) ................................ 2010-044434

(51) Int. Cl.
*H01L 25/11* (2006.01)
(52) U.S. Cl.
USPC ............ 257/737; 257/E25.027; 257/E21.705; 438/108
(58) Field of Classification Search
USPC .................. 257/686, 705, E25.027, E21.705
See application file for complete search history.

(56) References Cited

U.S. PATENT DOCUMENTS

| | | | |
|---|---|---|---|
| 6,649,448 B2 * | 11/2003 | Tomihara ....................... | 438/113 |
| 2001/0035587 A1 | 11/2001 | Kondo et al. | |
| 2006/0102987 A1 | 5/2006 | Saiki et al. | |
| 2006/0139893 A1 | 6/2006 | Yoshimura et al. | |
| 2007/0077685 A1 * | 4/2007 | Noda et al. ..................... | 438/107 |
| 2008/0197470 A1 * | 8/2008 | Yoshimura et al. ........... | 257/686 |
| 2008/0308915 A1 * | 12/2008 | Shen et al. .................... | 257/668 |
| 2009/0032976 A1 | 2/2009 | Misumi et al. | |
| 2010/0029059 A1 | 2/2010 | Matsumura et al. | |
| 2010/0029061 A1 | 2/2010 | Kamiya et al. | |
| 2011/0189835 A1 * | 8/2011 | Sugo et al. ..................... | 438/464 |
| 2011/0281396 A1 | 11/2011 | Yoshimura et al. | |
| 2012/0189845 A1 | 7/2012 | Misumi et al. | |
| 2012/0306103 A1 | 12/2012 | Yoshimura et al. | |

FOREIGN PATENT DOCUMENTS

CN    1700467    11/2005

(Continued)

OTHER PUBLICATIONS

Notification of Reasons for Refusal dated Aug. 23, 2013 in corresponding Japanese patent application No. 2010-044434.
First Office Action dated Aug. 28, 2013 in corresponding Chinese patent application No. 2011100501582.2.

(Continued)

*Primary Examiner* — S. V. Clark
*Assistant Examiner* — Krista Soderholm
(74) *Attorney, Agent, or Firm* — Knobbe, Martens, Olson & Bear LLP

(57) ABSTRACT

The present invention provides a die bond film for adhering, onto a semiconductor element that is electrically connected to an adherend with a bonding wire, another semiconductor element and that enables loading of the other semiconductor element and improvement in the manufacturing yield of a semiconductor device by preventing deformation and cutting of the bonding wire, and a dicing die bond film. The die bond film of the present invention is a die bond film for adhering, onto a semiconductor element that is electrically connected to an adherend with a bonding wire, another semiconductor element, in which at least a first adhesive layer that enables a portion of the bonding wire to pass through inside thereof by burying the portion upon press bonding and a second adhesive layer that prevents the other semiconductor element from contacting with the bonding wire are laminated.

15 Claims, 4 Drawing Sheets

(56) References Cited

FOREIGN PATENT DOCUMENTS

| CN | 101645427 | 2/2010 |
|---|---|---|
| JP | 2001-308262 A | 11/2001 |
| JP | 2004-142430 | 5/2004 |
| JP | 2006-140348 | 6/2006 |
| JP | 2007-126622 | 5/2007 |
| TW | 200633086 | 9/2006 |

OTHER PUBLICATIONS

Preliminary Notice of First Office Action dated Oct. 24, 2013 in corresponding Taiwanese patent application No. 100105826.
Preliminary Notice of First Office Action dated Mar. 11, 2014 in corresponding Taiwanese patent application No. 100105826.

* cited by examiner (a)

(b)

(a)

(b)

DIE BOND FILM, DICING DIE BOND FILM, AND SEMICONDUCTOR DEVICE

This application claims priority to Japanese Patent Application No. 2010-044434, filed Mar. 1, 2010. The aforementioned application is hereby incorporated by reference in its entirety.

BACKGROUND OF THE INVENTION

1. Field of the Invention

The present invention relates to a die bond film that is used to adhere, onto a semiconductor element such as a semiconductor chip that is electrically connected to an adherend such as a lead frame with a bonding wire, another semiconductor element. The present invention also relates to a dicing die bond film in which the die bond film and a dicing film are laminated. Further, the present invention relates to a semiconductor device that is manufactured using the die bond film or the dicing die bond film.

2. Description of the Related Art

Demands for attaining higher density and higher integration of a semiconductor device have been becoming stronger corresponding to enhanced functionality of electronic equipment, and the capacity and the density of semiconductor packages have been increasing in recent years. In order to answer to this demand, for example, there has been investigated a method of implementing a smaller size, smaller thickness, and larger capacity semiconductor package by laminating, onto a semiconductor chip, another semiconductor chip in multiple stages. A wire bonding method using a bonding wire is normally broadly adopted as a method of electrically connecting a semiconductor chip and a substrate in such semiconductor package.

When die-bonding, onto a semiconductor chip that is loaded on a substrate, another semiconductor chip, it is necessary to die-bond the other semiconductor chip while avoiding an electrode pad for wire bonding on the semiconductor chip. Because of this, there is adopted a method of securing a region where a semiconductor chip 102 and a substrate 101 are electrically connected by a bonding wire 105 using another semiconductor chip 103 having a smaller area than that of the semiconductor chip 102 loaded on the substrate 101 with an adhesive 104 or the like as shown in FIG. 8A, for example (refer to FIG. 5 of Japanese Patent Application Laid-Open No. 2001-308262).

Further, when laminating a semiconductor chip 103 having a similar area as that of the semiconductor chip 102 loaded on the substrate 101 as shown in FIG. 8B, there is adopted a method of having a spacer 106 whose area is smaller than that of the semiconductor chip 102 between the semiconductor chip 102 and the semiconductor chip 103 (refer to FIG. 4 of Japanese Patent Application Laid-Open No. 2001-308262). With this configuration, the semiconductor chip 103 is prevented from overlapping the bonding wire 105 that electrically connects the semiconductor chip 102 and the substrate 101. However, a new step of providing the spacer 106 onto the semiconductor chip 102 is necessary in this method. It is also necessary to make the thickness of the spacer 106 sufficiently large for preventing the semiconductor chip 103 from contacting the bonding wire 105. As a result, this method is unsuitable for attaining a thinner semiconductor device.

In order to solve such problems, there is disclosed a method of forming an adhesive layer for fixing made of a die bond resin by applying the die bond resin to the semiconductor chip 102 that is electrically connected to the substrate 101 by the bonding wire 105 such that a sufficient distance can be secured between the semiconductor chip 102 and the semiconductor chip 103, and then laminating the semiconductor chip 103 (refer to FIG. 1 of Japanese Patent Application Laid-Open No. 2001-308262). However, the backside of the semiconductor chip 103 and the bonding wire 105 may contact with each other when die-bonding the semiconductor chip 103 onto the adhesive layer for fixing and the bonding wire 105 may deform or cut. As a result, it becomes difficult to maintain electrical connection between the substrate 101 and the semiconductor chip 102, and the yield may decrease.

SUMMARY OF THE INVENTION

The present invention was made in view of the above-described problems, and an object thereof is to provide a die bond film for adhering, onto a semiconductor element that is electrically connected to an adherend with a bonding wire, another semiconductor element, and that enables loading of the other semiconductor element and improvement in the manufacturing yield of a semiconductor device by preventing deformation and cutting of the bonding wire, and a dicing die bond film. Another object of the present invention is to provide a semiconductor device having excellent reliability by manufacturing the device using the die bond film or the dicing die bond film.

The present inventors investigated a die bond film, a dicing die bond film, and a semiconductor device to solve the conventional problems. As a result, it was found that the objects are achieved by making the die bond film have a configuration in which the film has at least a first adhesive layer that enables a portion of the bonding wire to pass through inside thereof and a second adhesive layer that prevents a semiconductor element that is loaded onto another semiconductor element from contacting with the bonding wire, and completed the present invention.

That is, in order to solve the above-described problems, the die bond film according to the present invention is a die bond film for adhering, onto a semiconductor element that is electrically connected to an adherend with a bonding wire, another semiconductor element, wherein at least a first adhesive layer that enables a portion of the bonding wire to pass through inside thereof by burying the portion upon press bonding and a second adhesive layer that prevents the other semiconductor element from contacting with the bonding wire are laminated.

According to the above-described configuration, because the first adhesive layer enables a portion of the bonding wire to pass through inside thereof by burying the portion when press-bonding the die bond film onto the semiconductor element, there is no need to have a spacer having a smaller area than the semiconductor element between the semiconductor element and another semiconductor element as with the conventional semiconductor devices. There is also no need to secure a region for an electrode pad for a bonding wire by making the size of the other semiconductor element smaller than that of the semiconductor element. Further, because the second adhesive layer that prevents the other semiconductor element from contacting with the bonding wire is provided on the first adhesive layer, the bonding wire can be prevented from being deformed or cut when die-bonding the other semiconductor element. As a result, good electrical connection between the semiconductor element and the adherend can be maintained, and a semiconductor device having excellent reliability can be manufactured.

Each of the first adhesive layer and the second adhesive layer in the above-described configuration is formed from at least an epoxy resin, a phenol resin, and an acrylic resin.

X/(X+Y) of the first adhesive layer, where the total weight of the epoxy resin and the phenol resin is X parts by weight and the weight of the acrylic resin is Y parts by weight, is preferably in a range of 0.5 to 0.95, and X/(X+Y) of the second adhesive layer is preferably in a range of 0.15 to less than 0.5. Concerning compounded amounts of the epoxy resin, the phenol resin, and the acrylic resin in the first adhesive layer, a portion of the bonding wire can be buried upon press bonding by making X/(X+Y) be 0.5 or more and by making the total weight of the epoxy resin and the phenol resin larger than the weight of the acrylic resin. With this configuration, the die bond film can be pasted onto the semiconductor element in a state where the bonding wire is passed through inside the first adhesive layer. On the other hand, the first adhesive layer is prevented from spreading out upon press bonding and an electrical terminal for wire bonding on the side of the adherend can be prevented from being blocked by making X/(X+Y) 0.95 or less. Concerning the compounded amounts of the epoxy resin, the phenol resin, and the acrylic resin in the second adhesive layer, the bonding wire can be prevented from contacting with the other semiconductor element when die-bonding the other semiconductor element onto the semiconductor element by making X/(X+Y) less than 0.5 and by making the weight of the acrylic resin larger than the total weight of the epoxy resin and the phenol resin. On the other hand, good tackiness with a semiconductor wafer can be achieved by making X/(X+Y) 0.15 or more.

In the above-described configuration, the total thickness of the die bond film is preferably in a range of 40 to 120 μm, and $d_1/(d_1+d_2)$ is preferably in a range of 0.6 to 0.95 where $d_1$ (μm) is the thickness of the first adhesive layer and $d_2$ (μm) is the thickness of the second adhesive layer. By making $d_1/(d_1+d_2)$ be 0.6 or more for the die bond film having a total thickness of 40 to 120 μm, the bonding wire that electrically connects a semiconductor element and an adherend can be prevented from sticking out to the second adhesive layer side, and the burying of the bonding wire can be kept inside the first adhesive layer. By making $d_1/(d_1+d_2)$ be 0.95 or less, contact with the other semiconductor element by the bonding wire can be securely prevented by the second adhesive layer.

In the above-described configuration, the shear loss modulus G" of the first adhesive layer at 120° C. before thermal curing is preferably in a range of $5 \times 10^2$ to $1.5 \times 10^4$ Pa, and the shear loss modulus G" of the second adhesive layer at 120° C. before thermal curing is preferably in a range of $2 \times 10^4$ to $1 \times 10^6$ Pa. By making the shear loss modulus G" of the first adhesive layer at 120° C. before thermal curing be $5 \times 10^2$ to $1.5 \times 10^4$ Pa, the bonding wire can be buried without generating voids (air bubbles) and the first adhesive layer is prevented from being spread out when press-bonding the die bond film onto the semiconductor element. On the other hand, by making the shear loss modulus G" of the second adhesive layer at 120° C. before thermal curing be $2 \times 10^4$ to $1 \times 10^6$ Pa, a portion of the bonding wire that is buried in the first adhesive layer can be prevented from contacting with the backside of the other semiconductor element when die-bonding the other semiconductor element onto the semiconductor element.

In the above-described configuration, the content of metal ions in the first adhesive layer is preferably 100 ppm or less. With this configuration, even if a plurality of bonding wires pass through the inside of the first adhesive layer, the generation of electrical interference between these bonding wires can be prevented, and a semiconductor device with high reliability can be manufactured.

Further, in the above-described configuration, when at least one of the second adhesive layer or other adhesive layers when providing the other adhesive layers on the second adhesive layer contains at least one of a dye or a pigment. With this configuration, the front and the back of the die bond film can be easily distinguished, and the film can be easily distinguished from other kinds of die bond films. As a result, down time can be reduced in the manufacturing process of a semiconductor device, and the yield can be improved.

In the above-described configuration, the glass transition temperature of the first adhesive layer is preferably 20 to 60° C., and the glass transition temperature of the second adhesive layer is preferably 60° C. or less. By making the glass transition temperature of the first adhesive layer be in a range of 20 to 60° C., the peeling power from the dicing film can be controlled and a good pickup property can be secured. By making the glass transition temperature of the second adhesive layer be 60° C. or less, adhering strength to a silicon wafer can be secured.

In the above-described configuration, the tensile storage modulus at 175° C. after thermal curing is preferably in a range of 0.5 to 100 MPa. With this configuration, moisture absorption reliability can be secured.

Further, in order to solve the above-described problems, the dicing die bond film according to the present invention includes a dicing film in which at least a pressure-sensitive adhesive layer is provided on a base, and the die bond film that is provided on the pressure-sensitive adhesive layer.

The semiconductor device according to the present invention is manufactured with the above-described die bond film or the above-described dicing die bond film in order to solve the above-described problems. With this configuration, a three-dimensionally mounted semiconductor device having high reliability can be provided without using a spacer in which a portion of the bonding wire is buried inside the first adhesive layer and the second adhesive layer prevents the bonding wire from contacting with another semiconductor element.

According to the present invention, because a portion of the bonding wire can be buried and passed through inside of the first adhesive layer when press-bonding the die bond film onto the semiconductor element, it is not necessary to have a spacer whose area is smaller than that of the semiconductor element between the semiconductor element and another semiconductor element as with the conventional semiconductor devices. Further, it is not necessary to secure a region for an electrode pad for a bonding wire by making the size of the other semiconductor element smaller than that of the semiconductor element. Furthermore, because the second adhesive layer prevents the bonding wire from contacting with another semiconductor element, the bonding wire can be prevented from being deformed or cut. As a result, the electrical connection between the semiconductor element and an adherend can be maintained, and a semiconductor device having excellent reliability can be manufactured.

Figure 1:
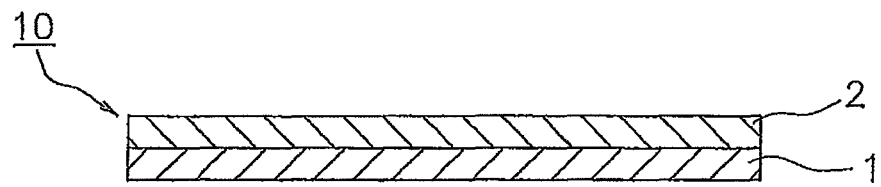
FIG. 1 is a schematic sectional drawing showing the die bond film according to one embodiment of the present invention.

DESCRIPTION OF THE REFERENCE NUMERALS 1 first adhesive layer
2 second adhesive layer
4 semiconductor wafer
5 another semiconductor chip
6 adherend
7 bonding wire
9 sealing resin
10 die bond film
11 dicing die bond film
12 dicing film
13 base
14 pressure-sensitive adhesive layer
15 semiconductor chip
17 dicing ring
101 substrate
102 semiconductor chip
103 another semiconductor chip
104 adhesive
105 bonding wire
106 spacer

DETAILED DESCRIPTION OF THE PREFERRED EMBODIMENTS

The die bond film according to the present embodiment is explained below. FIG. 1 is a schematic sectional drawing schematically showing the die bond film according to the present embodiment.

As shown in FIG. 1, a die bond film 10 has a structure in which at least a first adhesive layer 1 and a second adhesive layer 2 are laminated. However, it may have a configuration in which another adhesive layer is appropriately laminated as necessary. In this case, the other adhesive layer is preferably provided on the second adhesive layer 2.

Each of the first adhesive layer 1 and the second adhesive layer 2 is preferably formed from at least an epoxy resin, a phenol resin, and an acrylic resin. Here, $X/(X+Y)$ of the first adhesive layer 1, where the total weight of the epoxy resin and the phenol resin is $X$ parts by weight and the weight of the acrylic resin is $Y$ parts by weight, is preferably in a range of 0.5 to 0.95, more preferably in a range of 0.51 to 0.94, and further preferably in a range of 0.52 to 0.93. By making $X/(X+Y)$ be 0.5 or more, the bonding wire can be buried in the first adhesive layer 1 when press-bonding the die bond film 10 on the semiconductor element that is electrically connected to an adherend with the bonding wire. On the other hand, by making $X/(X+Y)$ be 0.95 or less, the first adhesive layer 1 is prevented from spreading out upon press bonding and an electrical terminal for wire bonding on the side of the adherend can be prevented from being blocked.

Further, $X/(X+Y)$ of the second adhesive layer 2 is preferably in a range of 0.15 to less than 0.5, more preferably in a range of 0.16 to less than 0.49, and further preferably in a range of 0.17 to less than 0.48. By making $X/(X+Y)$ be 0.15 or more, good tackiness with a semiconductor wafer can be achieved. On the other hand, by making $X/(X+Y)$ be less than 0.5, the portion of the bonding wire that is buried inside of the first adhesive layer 1 can be prevented from contacting with the backside of the other semiconductor element when diebonding the other semiconductor element onto the semiconductor element. With this configuration, deformation and cutting of the bonding wire are prevented, and a semiconductor device having high reliability can be manufactured.

Epoxy resins that are generally used as an adhesive composition can be used as the above-described epoxy resin without any special limitation. Examples of the epoxy resin that can be used include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol novolak type, orthocresol novolak type, tris-hydroxyphenylmethane type, and tetraphenylolethane type epoxy resins; hydantoin type epoxy resins; tris-glycidylisocyanurate type epoxy resins; and glycidylamine type epoxy resins. These may be used either alone or in combination of two or more kinds of them. Among these epoxy resins, novolak type epoxy resins, biphenyl type epoxy resins, tris-hydroxyphenylmethane type epoxy resins, and tetraphenylolethane type epoxy resins are especially preferable because these epoxy resins are rich in reactivity with a phenol resin as a curing agent and have excellent heat resistance. Moreover, these epoxy resins contain little ionic impurities that corrode a semiconductor element.

The phenol resin acts as a curing agent for the epoxy resin. Examples of the phenol resin include novolak type phenol resins such as a phenol novolak resin, a phenol aralkyl resin, a cresol novolak resin, a tert-butylphenol novolak resin, and a nonylphenol novolak resin; resol type phenol resins; and polyoxystyrene such as polyparaoxystyrene. These may be used either alone or in combination of two or more kinds of them. Among these phenol resins, a biphenyl type phenol novolak resin represented by the following chemical formula and a phenol aralkyl resin are preferable because the connection reliability of a semiconductor device can be improved.

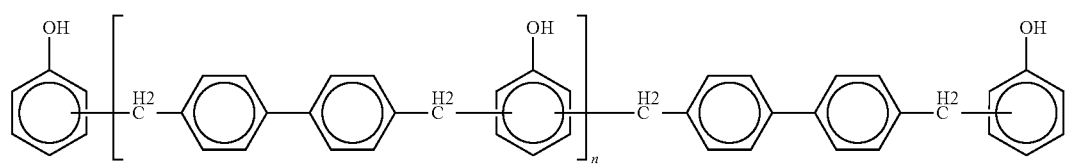

[Formula 1]

(n is a natural number of 0 to 10.)

n is preferably a natural number of 0 to 10, and more preferably a natural number of 0 to 5. By making n be in this range, fluidity of the die bond film 10 can be secured.

The phenol resin is preferably compounded so that the hydroxyl groups in the phenol resin become 0.5 to 2.0 equivalent per 1 equivalent of the epoxy groups in the epoxy resin. It is more preferably 0.8 to 1.2 equivalent. When the compounded ratio comes out of this range, curing does not proceed sufficiently, and characteristics of the epoxy resin cured product easily deteriorate.

A thermosetting catalyst may be used as a constituent material of the die bond film 10 in the present embodiment. The thermosetting catalyst is not especially limited, and examples thereof include imidazole compounds, triphenylphosphine compounds, amine compounds, triphenylborane compounds, and trihalogen borane compounds. These may be used either alone or in combination of two or more kinds of them.

Examples of the imidazole compounds include 2-methylimidazole (trade name: 2 MZ), 2-undecylimidazole (trade name: C11-Z), 2-heptadecylimidazole (trade name: C17Z), 1,2-dimethylimidazole (trade name: 1.2DMZ), 2-ethyl-4-methylimidazole (trade name: 2E4 MZ), 2-pehnylimidazole (trade name: 2PZ), 2-phenyl-4-methylimidazole (trade name: 2P4MZ), 1-benzyl-2-methylimidazole (trade name: 1B2MZ), 1-benzyl-2-phenylimidazole (trade name: 1B2PZ), 1-cyanoethyl-2-methylimidazole (trade name: 2MZ-CN), 1-cyanoethyl-2-undecylimidazole (trade name: C11Z-CN), 1-cyanoethyl-2-phenylimidazolium trimellitate (trade name: 2PZCNS-PW), 2,4-diamino-6-[2'-methylimidazolyl-(1')]-ethyl-s-triazine (trade name: 2MZ-A), 2,4-diamino-6-[2'-undecylimidazolyl-(1')]-ethyl-s-triazine (trade name: C11Z-A), 2,4-diamino-6-[2'-ethyl-4'-methylimidazolyl-(1')]-ethyl-s-t riazine (trade name: 2E4MZ-A), 2,4-diamino-6-[2'-methylimidazolyl-(1')]-ethyl-s-triazine isocyanurate adduct (trade name: 2MA-OK), 2-phenyl-4,5-dihydroxymethylimidazole (trade name: 2PHZ-PW), and 2-phenyl-4-methyl-5-hydroxymethylimidazole (trade name: 2P4 MHZ-PW) (all manufactured by Shikoku Chemicals Corporation).

The triphenylphosphine compounds are not especially limited, and examples thereof include triorganophosphines such as triphenylphosphine, tributylphosphine, tri(p-methylphenyl)phosphine, tri(nonylphenyl)phosphine, and diphenyltolylphosphine; tetraphenylphosphoniumbromide (trade name: TPP-PB); methyltriphenylphosphonium (trade name: TPP-MB), methyltriphenylphosphonium chloride (trade name: TPP-MC); methoxymethyltriphenylphosphonium (trade name: TPP-MOC), and benzyltriphenylphosphonium chloride (trade name: TPP-ZC) (all manufactured by Hokko Chemical Industry Co., Ltd.). The triphenylphosphine compounds are preferably compounds that are substantially insoluble in the epoxy resin. When a compound insoluble in the epoxy resin is used, excess thermal curing can be suppressed. Examples of the thermosetting catalyst having a triphenylphosphine structure and is substantially insoluble in the epoxy resin include methyltriphenylphosphonium (trade name: TPP-MB). The "insolubility" means that the thermosetting catalyst made from the triphenylphosphine compound is insoluble in a solvent made from the epoxy resin, and more specifically, it means that the thermosetting catalyst does not dissolve in an amount of 10% by weight or more in a temperature range of 10 to 40° C.

The triphenylborane compounds are not especially limited, and examples thereof include a triphenylborane compound having a triphenyl borane structure and a triphenylphosphine structure. Compounds having the triphenylborane structure and the triphenylphosphine structure are not especially limited, and examples thereof include tetraphenylphosphonium tetraphenylborate (trade name: TPP-K), tetraphenylphosphonium tetra-p-triborate (trade name: TPP-MK), benzyltriphenylphosphonium tetraphenylborate (trade name: TPP-ZK), and triphenylphosphine triphenylborane (trade name: TPP-S) (all manufactured by Hokko Chemical Industry Co., Ltd.).

The amino compounds are not especially limited, and examples thereof include monoethanolamine trifluoroborate (manufactured by Stella Chemifa Corporation) and dicyandiamide (manufactured by Nacalai Tesque, Inc.).

The trihalogen borane compounds are not especially limited, and examples thereof include trichloroborane.

The compounded amount of the thermosetting catalyst is preferably in a range of 0.01 to 1 part by weight, more preferably in a range of 0.01 to 0.5 parts by weight, and especially preferably in a range of 0.01 to 0.4 parts by weight to 100 parts by weight of the organic component. By making the compounded amount be 0.01 parts by weight or more, unreacted epoxy groups can be reduced or eliminated by polymerizing the epoxy groups that are unreacted during die bonding together by a post curing step, for example. As a result, another semiconductor element can be securely adhered and fixed onto the semiconductor element, and a semiconductor device without peeling can be manufactured. On the other hand, by making the compounded amount be 1 part by weight or less, inhibition of curing can be prevented.

Examples of the acrylic resin include polymers having one kind or two or more kinds of acrylic acid ester (s) or methacrylic acid ester (s) having a straight-chain or branched alkyl group having 30 or less carbon atoms, and especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methyl acrylate; sulfonic acid group-containing monomers such as styrenesulfonic acid, allylsulfonic acid, 2-(meth) acrylamide-2-methylpropanesulfonic acid, (meth) acrylamidepropanesulfonic acid, sulfopropyl(meth) acrylate, and (meth) acryloyloxynaphthalenesulfonic acid; and phosphate group-containing monomers such as 2-hydroxyethylacryloylphosphate. These may be used either alone or in combination of two or more kinds of them.

Acrylic copolymers are preferable as the acrylic resin. The monomer components that are used in the acrylic copolymer are not especially limited, and examples thereof include butyl acrylate and ethyl acrylate. In the present invention, preferable are copolymers that contain 10 to 60% by weight of butyl acrylate and 40 to 90% by weight of ethyl acrylate to the whole monomer components.

Further, other monomer components that are copolymerizable with the above-described monomer components are not especially limited, and examples thereof include acrylonitrile. The used amount of these copolymerizable monomer components is preferably in a range of 1 to 20% by weight to the whole monomer components. By incorporating other monomer components in this range, the cohesive force, tackiness, and the like can be modified.

The polymerization method of the acrylic copolymer is not especially limited, and conventionally known methods such as a solution polymerization method, a bulk polymerization method, a suspension polymerization method, and an emulsion polymerization method can be adopted.

The glass transition temperature (Tg) of the acrylic copolymer is preferably −30 to 30° C., and more preferably −20 to 15° C. By making the glass transition temperature be −30° C. or more, heat resistance can be secured. On the other hand, by making the glass transition temperature be 30° C. or less, the effect of preventing chip fly after dicing a semiconductor wafer having a rough surface can be improved.

The weight average molecular weight of the acrylic copolymer is preferably 100,000 or more, more preferably 600,000 to 1,200,000, and especially preferably 700,000 to 1,000,000. By making the weight average molecular weight be 100,000 or more, excellent tackiness to the surface of an adherend such as a wiring board, a semiconductor element, or a semiconductor wafer can be obtained at a high temperature and heat resistance can be improved. By making the weight average molecular weight be 1,200,000 or less, dissolution in an organic solvent can be made easy. The weight average molecular weight is a polystyrene equivalent using an analytical curve of polystyrene standard obtained by gel permeation chromatography (GPC).

The die bond film 10 may contain a filler such as an inorganic filler or an organic filler. An inorganic filler is preferable from the viewpoints of improvement of handing property and heat conductivity, adjustment of melt viscosity, and impartation of a thixotropic property. However, a portion of a plurality of bonding wires is buried inside of the first adhesive layer 1, and it is not preferable for these bonding wires to electrically interfere with each other. Therefore, it is not preferable to add an inorganic filler capable of imparting conductivity to the first adhesive layer 1.

The inorganic filler is not especially limited, and examples thereof include silica, aluminum hydroxide, calcium hydroxide, magnesium hydroxide, antimony trioxide, calcium carbonate, magnesium carbonate, calcium silicate, magnesium silicate, calcium oxide, magnesium oxide, aluminum oxide, aluminum nitride, aluminum borate, boron nitride, crystalline silica, and amorphous silica. These may be used either alone or in combination of two or more kinds of them. Aluminum oxide, aluminum nitride, boron nitride, crystalline silica, and amorphous silica are preferable from the viewpoint of improvement of the heat conductivity. Silica is preferable from the viewpoint of balance with tackiness of the die bond film 10. Examples of the organic filler include polyimide, polyamideimide, polyetheretherketone, polyetherimide, polyesterimide, nylon, and silicone. These may be used either alone or in combination of two or more kinds of them.

The average particle size of the filler is preferably 0.005 to 10 μm, and more preferably 0.05 to 1 μm. When the average particle size of the filler is 0.005 μm or more, good wettability to an adherend can be obtained, and a decrease of tackiness can be suppressed. On the other hand, by making the average particle size be 10 μm or less, the effect of reinforcing the die bond film 10 due to the addition of the filler can be increased and heat resistance can be improved. Fillers having different average particle sizes may be combined and used. Further, the average particle size of the filler is obtained by using a light intensity type particle size distribution meter (device name: LA-910) manufactured by HORIBA, Ltd.

The content of the filler is preferably more than 0 part by weight and 80 parts by weight or less, and more preferably more than 0 part weight and 70 parts by weight or less to 100 parts by weight as the total amount of the phenol resin and the acrylic resin. When the content of the filler is 0 part by weight, there is no reinforcing effect due to the addition of the filler, and heat resistance of the die bond film 10 may deteriorate. On the other hand, when the content exceeds 80 parts by weight, wettability to a semiconductor element and a semiconductor wafer may deteriorate, and tackiness may decrease.

The shape of the filler is not especially limited, and examples thereof include a sphere and an ellipsoid.

When crosslinking the die bond film 10 to a certain degree in advance, a polyfunctional compound that reacts with a functional group at the end of the molecular chain of the polymer is preferably added as a crosslinking agent during production. With this configuration, adhesion characteristics at a high temperature can be improved and the heat resistance can be improved. The crosslinking agent may be added to both the first adhesive layer 1 and the second adhesive layer 2 or may be added only to either one of these layers.

A conventionally known crosslinking agent can be adopted as the crosslinking agent. Especially, preferable are polyisocyanate compounds such as tolylene diisocyanate, diphenylmethane diisocyanate, p-phenylene diisocyanate, 1,5-naphthalene diisocyanate, and adducts of polyalcohols and diisocyanates. The added amount of the crosslinking agent is normally preferably 0.05 to 7 parts by weight to 100 parts by weight of the above-described polymer. When the amount of the crosslinking agent to be added is more than 7 parts by weight, it is not preferable because the adhering strength decreases. On the other hand, when the amount is less than 0.05 parts by weight, it is not preferable because the cohesive strength becomes insufficient. Further, other polyfunctional compounds such as an epoxy resin may be compounded together with such polyisocyanate compounds as necessary.

Further, other additives can be appropriately compounded into the die bond film 10 as necessary. Examples of other additives include a frame retardant, a silane coupling agent, and an ion trapping agent.

Examples of the flame retardant include antimony trioxide, antimony pentoxide, and a brominated epoxy resin. These may be used either alone or in combination of two or more kinds of them.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds may be used either alone or in combination of two or more kinds of them.

Examples of the ion trapping agent include hydrotalcites and bismuth hydroxide. These may be used either alone or in combination of two or more kinds of them.

The shear loss modulus G" of the first adhesive layer 1 at 120° C. before thermal curing is preferably in a range of $5 \times 10^2$ to $1.5 \times 10^4$ Pa, more preferably in a range of $5 \times 10^2$ to $1.2 \times 10^4$ Pa, and further preferably in a range of $5 \times 10^2$ to $1 \times 10^4$ Pa. By making the shear loss modulus G" be $5 \times 10^2$ or more, the first adhesive layer 1 is prevented from spreading out when press-bonding the die bond film 10 onto a semiconductor element, and the electrical terminal for wire bonding on the side of the adherend can be prevented from being blocked. On the other hand, by making the shear loss modulus G" be $1.5 \times 10^4$ Pa or less, the bonding wire can be buried in the first adhesive layer 1 without generating voids (air bubbles) during press bonding.

The shear loss modulus G" of the second adhesive layer 2 at 120° C. before thermal curing is preferably in a range of $2\times10^4$ to $1\times10^6$ Pa, more preferably in a range of $2\times10^4$ to $8\times10^5$ Pa, and further preferably in a range of $2\times10^4$ to $5\times10^5$ Pa. By making the shear loss modulus G" be $2\times10^4$ or more, a portion of the bonding wire that is buried in the first adhesive layer 1 can be prevented from contacting with the backside of the other semiconductor element when die-bonding the other semiconductor element onto the semiconductor element. On the other hand, by making the shear loss modulus G" be $1\times10^6$ Pa or less, adhesion with a semiconductor wafer can be secured. The values of the shear loss modulus G" of the first adhesive layer 1 and the second adhesive layer 2 can be measured by the method described later, for example.

The shear adhering strength of the first adhesive layer 1 to the semiconductor element during temporary fixing when die-bonding the die bond film 10 according to the present embodiment onto the semiconductor element is preferably 0.2 MPa or more, and more preferably 0.2 to 10 MPa. By making the shear adhering strength be 0.2 MPa or more, shear deformation does not occur at the adhering surface between the first adhesive layer 1 and the semiconductor element or between the second adhesive layer 2 and the other semiconductor element due to ultrasonic vibration or heating even when the wire bonding step is performed without completely thermally curing the die bond film 10 by heating. That is, the semiconductor element and the like do not move due to ultrasonic vibration during wire bonding, and accordingly, the success rate of wire bonding can be kept from decreasing.

The 180-degree peeling strength at the interface between the second adhesive layer 2 and the semiconductor wafer when the semiconductor wafer is mounted on the second adhesive layer 2 is preferably 0.5 N/10 mm or more, more preferably 1 N/10 mm or more, and further preferably 1.5 N/10 mm or more. By making the 180-degree peeling strength be 0.5 N/10 mm or more, generation of chip fly of the semiconductor element can be reduced when forming the semiconductor element by performing blade dicing on the semiconductor wafer together with the die bond film 10. The 180-degree peeling strength is a value before thermally curing the second adhesive layer 2.

The total thickness of the die bond film 10 is preferably in a range of 40 to 120 μm. By making the total thickness be 40 μm or more, the bonding wire can be buried. On the other hand, by making the total thickness be 120 μm or less, a semiconductor device with a smaller thickness can be manufactured. When the thickness of the first adhesive layer 1 is $d_1$ (μm) and the thickness of the second adhesive layer 2 is $d_2$ (μm), $d_1/(d_1+d_2)$ is preferably in a range of 0.6 to 0.95, more preferably in a range of 0.6 to 0.9, and further preferably in a range of 0.7 to 0.9. By making $d_1/(d_1+d_2)$ be 0.6 or more, the bonding wire that is buried inside of the first adhesive layer 1 can be prevented from spreading out to the side of the second adhesive layer 2, and contact of another semiconductor element with the bonding wire can be prevented. On the other hand, by making $d_1/(d_1+d_2)$ be 0.95 or less, contact of another semiconductor element with the bonding wire can be prevented even when the bonding wire spreads out to the side of the second adhesive layer 2.

The content of metal ions in the first adhesive layer 1 is preferably 100 ppm or less, and more preferably 80 ppm or less. By making the content of metal ions be 100 ppm or less, even when a plurality of bonding wires pass through the inside of the first adhesive layer 1, the generation of electrical interference between these bonding wires can be prevented, and a semiconductor device with high reliability can be manufactured. The metal ions are originated from dyes and pigments described later, for example.

At least one of a dye or a pigment is preferably contained in the second adhesive layer 2. With this configuration, the front and the back of the die bond film 10 can be easily distinguished, and the film can be easily distinguished from other kinds of die bond films. As a result, down time can be reduced in the manufacturing process of a semiconductor device, and the yield can be improved. When other adhesive layers are laminated on the second adhesive layer 2, dyes and/or pigments may be added also in the other adhesive layers.

The dyes are not especially limited, and specific examples thereof include a nitro dye, a nitroso dye, a stilbene dye, a pyrazolone dye, a thiazole dye, an azo dye, a polyazo dye, a carbonium dye, a quinoanyl dye, an indophenol dye, an indoaniline dye, an indamine dye, a quinonimine dye, an azine dye, an oxidizing dye, an oxazine dye, a thiazine dye, an acryzine dye, a diphenylmethane dye, a triphenylmethane dye, a xanthene dye, a thioxanthene dye, a sulfurizing dye, a pyridine dye, a pyridone dye, a thiadiazole dye, a thiophene dye, a benzoisothiazole dye, a dicyanoimidazole dye, a benzopyran dye, a benzodifuranone dye, a quinoline dye, an indigo dye, a thioindigo dye, an anthraquinone dye, a benzophenone dye, a benzoquinone dye, a naphthoquinone dye, a phthalocyanine dye, a cyanine dye, a methine dye, a polymethine dye, an azomethine dye, a condensed methine dye, a naphthalimide dye, a perinone dye, a triarylmethane dye, a xanthene dye, an aminoketone dye, an oxyketone dye, and an indigoid dye. These dyes may be used either alone or in combination of two or more kinds of them.

The compounded amount of the dyes is preferably in a range of 0.1 to 1 part by weight, and more preferably 0.1 to 0.8 parts by weight to 100 parts by weight of all the components of the second adhesive layer 2. By making the compounded amount be 0.1 parts by weight or more, the second adhesive layer 2 can be more easily distinguished. On the other hand, by making the compounded amount be 1 part by weight or less, impurity ions can be reduced.

The pigments are not especially limited, and specific examples thereof include titaniumoxide, zinc oxide, talc, sienna, amber, kaolin, calciumcarbonate, iron oxide, lampblack, furnace black, ivoryblack, graphite, fullerene, carbon black, viridian, cobalt blue, emerald green, cobalt green, phthalocyanine green, phthalocyanine blue, milori blue, fast yellow, disazo yellow, condensed azo yellow, benzoimidazolone yellow, dinitroaniline orange, benzimidazolone yellow, perinone orange, toluidine red, permanent carmine, anthraquinonyl red, permanent red, naphthol red, condensed azo red, benzimidazolone carmine, benzimidazolone brown, anthrapyridine yellow, quinophthalone yellow, cobalt violet, and manganese violet. These pigments may be used either alone or in combination of two or more kinds of them.

The compounded amount of the pigments is preferably in a range of 0.3 to 5 parts by weight, and more preferably 0.3 to 3 parts by weight to 100 parts by weight of the all components of the second adhesive layer 2. By making the compounded amount be 0.3 parts by weight or more, the second adhesive layer 2 can be more easily distinguished. On the other hand, by making the compounded amount be 5 parts by weight or less, impurity ions can be reduced.

The average particle size of the pigments is preferably in a range of 0.01 to 101 μm, and more preferably in a range of 0.01 to 5 μm. By making the average particle size be in this range, the pigments can be uniformly dispersed. The average particle size of the pigments is obtained by using a light intensity type particle size distribution meter (device name: LA-910) manufactured by HORIBA, Ltd.

The volume resistivity of at least one of the first adhesive layer 1 and the second adhesive layer 2 is preferably $1\times10^{11}$ $\Omega\cdot$cm or more, and more preferably $1\times10^{12}$ $\Omega\cdot$cm or more. By making the volume resistivity be $1\times10^{11}$ $\Omega\cdot$cm or more, a sufficient insulating property of the first adhesive layer 1 and the second adhesive layer 2 can be obtained. Further, the relative permittivity of at least one of the first adhesive layer 1 and the second adhesive layer 2 is preferably 4.5 or less, and more preferably 4 or less. By making the relative permittivity be 4.5 or less, deterioration of the electric characteristics can be prevented. Furthermore, the dielectric tangent of at least one of the first adhesive layer 1 and the second adhesive layer 2 is preferably 0.02 or less, and more preferably 0.01 or less. By making the dielectric tangent be 0.02 or less, deterioration of the electric characteristics can be prevented.

The glass transition temperature of the first adhesive layer 1 is preferably in a range of 20 to 60° C., and more preferably in a range of 20 to 50° C. By making the glass transition temperature be in a range of 20 to 60° C., the peeling strength from the dicing film 12 can be controlled, and a good pickup property can be secured. The glass transition temperature of the second adhesive layer 2 is preferably 60° C. or less, and more preferably 50° C. or less. By making the glass transition temperature be 60° C. or less, the adhering strength to a silicon wafer can be secured.

The die bond film 10 is preferably protected by a separator (not shown in the drawings). The separator has a function as a protecting material for protecting the die bond film until it is used. The separator can also be used as a supporting base when transferring the die bond film 10 onto the dicing film. The separator is peeled off when pasting a workpiece onto the die bond film. A polyethylene terephthalate (PET) film, a polyethylene film, a polypropylene film, a plastic film whose surface is coated with a peeling agent such as a fluorine peeling agent or a long chain alkyl acrylate peeling agent, and paper can be used as the separator.

(Method of Manufacturing the Die Bond Film)

The first adhesive layer 1 is formed by applying a first adhesive composition for forming the first adhesive layer 1 onto a first release treatment film on which a silicone release treatment has been carried out to a prescribed thickness and then drying the composition under a prescribed condition. The drying condition can be set appropriately as necessary. The second adhesive layer 2 is formed by applying a second adhesive composition for forming the second adhesive layer 2 onto a second release treatment film on which a silicone release treatment has been carried out to a prescribed thickness and then drying the composition under a prescribed condition. The drying condition can be set appropriately as necessary. The first release treatment film and the second release treatment film are not especially limited, and an example thereof is a film made of polyethylene terephthalate.

The die bond film 10 according to the present embodiment can be produced by pasting these films together so that the first adhesive layer and the second adhesive layer serve as the pasting surface.

(Dicing Die Bond Film)

Next, a dicing die bond film having the die bond film 10 is explained. FIGS. 2A and 2B are schematic sectional drawings schematically showing the dicing die bond film according to the present embodiment.

As shown in FIG. 2A, the dicing die bond film 11 has a structure in which the die bond film 10 is laminated on the dicing film 12. The dicing film 12 has a structure in which at least a pressure-sensitive adhesive layer 14 is laminated on a base 13. The die bond film 10 is laminated on a pasting portion 14a of the die bond film of the pressure-sensitive adhesive layer 14. As shown in FIG. 2B, the present invention may be a dicing die bond film 11' having a configuration in which a die bond film 10' is laminated on the entire surface of the pressure-sensitive adhesive layer 14.

The base 13 serves as a base body for strength of the dicing die bond films 11 and 11'. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene (meth)acrylic acid copolymer; an ethylene (meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper. In the case where the pressure-sensitive adhesive layer 14 is of an ultraviolet-ray curing-type, the base 13 preferably has permeability to an ultraviolet ray.

Further, the material of the base material 13 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 14 and the die-bonding films 10, 10' is reduced by thermally shrinking the base material 13 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base material 13 in order to improve adhesiveness, holding properties, etc. with the adjacent layer.

The same type or different type of base material can be appropriately selected and used as the base material 13, and a base material in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base material 13 in order to give an antistatic function to the base material 13. The base material 13 may be a single layer or a multi layer of two or more types.

The thickness of the base material 13 can be appropriately decided without limitation particularly. However, it is generally about 5 to 200 μm.

The base 13 may contain various additives such as a coloring agent, a filler, a plasticizer, an antiaging agent, an antioxidant, a surfactant, and a flame retardant unless the effects of the present invention are not spoiled.

In the case where the pressure-sensitive adhesive layer 14 is formed from an ultraviolet-ray curing-type pressure-sensitive adhesive, a difference of the adhesive power with another portion 14b can be provided by irradiating only the portion 14a corresponding to the semiconductor wafer pasting portion of the pressure-sensitive adhesive layer 14 shown in FIG. 2B with an ultraviolet ray because the adhesive power can be easily decreased by increasing the degree of crosslinking by irradiation with an ultraviolet ray.

Figure 2:
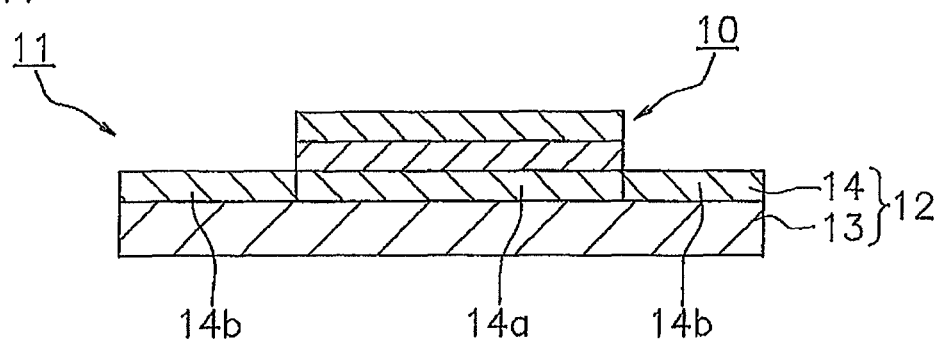
FIGS. 2A and 2B are schematic sectional drawings showing a dicing die bond film having the die bond film.
Figure 2:
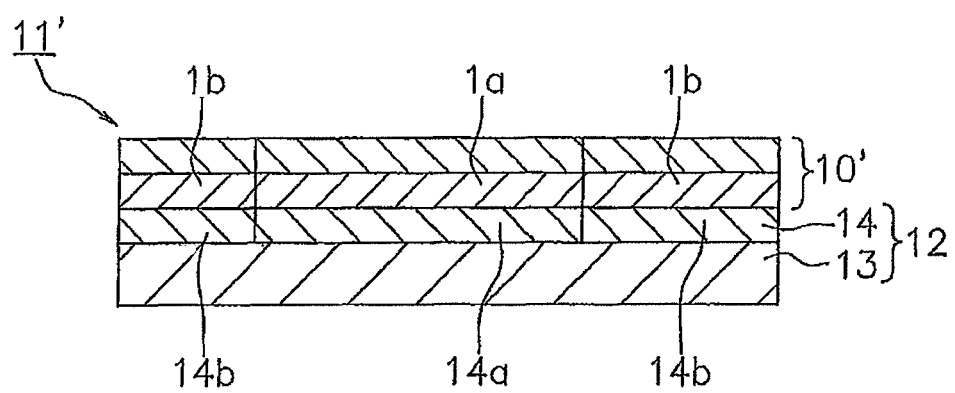

Further, by curing the ultraviolet curable pressure-sensitive adhesive layer 14 with the die-bonding film 10 shown in FIG. 2(*a*), the part 14*a* in which the adhesive strength is remarkably decreased can be formed easily. Because the die-bonding film 10 is pasted to the part 14*a* in which the adhesive strength is decreased by curing, the interface of the part 14*a* of the pressure-sensitive adhesive layer 14 and the first adhesive layer 1 has a characteristic of being easily peeled during pickup. On the other hand, the part not radiated by ultraviolet rays has sufficient adhesive strength, and forms the part 14*b*.

As described above, in the pressure-sensitive adhesive layer 14 of the dicing die bond film 11' shown in FIG. 2(*b*), the part 14*b* formed by a non-cured ultraviolet curable pressure sensitive adhesive sticks to the die-bonding film 10, and the holding force when dicing can be secured. The ultraviolet-ray curing-type pressure-sensitive adhesive can support the die bond film 10 for fixing a semiconductor chip to an adherend such as a substrate with a good balance of adhesion and peeling. The portion 14*b* in the pressure-sensitive adhesive layer 14 of the dicing die bond film 11 shown in FIG. 2A can fix a dicing ring. The adherend 6 is not especially limited, and examples thereof include various substrates such as a BGA substrate, a lead frame, a semiconductor element, and a spacer.

The ultraviolet curable pressure sensitive adhesive that is used has a ultraviolet curable functional group of a radical reactive carbon-carbon double bond, etc., and adherability. Examples of the ultraviolet curable pressure sensitive adhesive are an added type ultraviolet curable pressure sensitive adhesive in which a ultraviolet curable monomer component or an oligomer component is compounded into an acryl pressure sensitive adhesive or a rubber pressure sensitive adhesive.

The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

An example of the acrylic polymer is an acrylic polymer made of a monomer composition including an acrylic acid ester and a hydroxyl group-containing monomer. However, it is preferable not to include a carboxyl group-containing monomer.

A monomer represented by the chemical formula $CH_2=CHCOOR$ (R is an alkyl group having 6 to 10 carbon atoms and preferably 8 to 9 carbon atoms) is preferably used as the acrylic acid ester. When the number of carbon atoms is less than 6, the peeling strength becomes too large and the pickup property may deteriorate. On the other hand, when the number of carbon atoms exceeds 10, tackiness or adhesion with the die bond film decreases, and as a result, chip fly may occur during dicing.

Examples of the monomer represented by the above-described chemical formula include hexyl acrylate, heptylacrylate, octyl acrylate, isooctyl acrylate, 2-ethylhexyl acrylate, nonyl acrylate, isononyl acrylate, decyl acrylate, and isodecyl acrylate. Among these monomers, monomers in which the alkyl group R has 8 to 9 carbon atoms are preferable. Specifically, 2-ethylhexyl acrylate and isooctyl acrylate are preferable.

These monomers can be used either alone or in combination of two or more kinds of them.

The content of the acrylic acid ester is preferably 50 to 99% by weight, and more preferably 70 to 90% by weight to the whole monomer components. When the content is less than 50% by weight, the peeling strength becomes too large, and the pickup property may deteriorate. When the content exceeds 99% by weight, the adherability decreases and chip fly may occur during dicing.

The acrylic polymer may contain acrylic acid esters other than the monomers represented by the above-described chemical formula as a monomer component. Examples of such acrylic acid esters include acrylic acid esters having an aromatic ring (aryl acrylates such as phenyl acrylate) and acrylic acid esters having an alicyclic hydrocarbon group (cycloalkyl acrylates such as cyclopentyl acrylate and cyclohexyl acrylate, and isobornyl acrylate) in addition to the alkyl acrylates other than the monomers represented by the above-described chemical formula. Among these monomer components, alkyl acrylate and cycloalkyl acrylate are preferable, and alkyl acrylate is especially preferable. These acrylic acid esters may be used either alone or in combination of two or more kinds of them.

Examples of the alkyl acrylates other than the monomers represented by the above-described chemical formula include alkyl acrylates in which the alkyl group has 5 or fewer carbon atoms such as methyl acrylate, ethyl acrylate, propyl acrylate, isopropyl acrylate, butyl acrylate, isobutylacrylate, s-butyl acrylate, t-butyl acrylate, pentyl acrylate, and isopentyl acrylate and alkyl acrylates in which the alkyl group has 11 or more (preferably 11 to 30) carbon atoms such as undecyl acrylate, dodecyl acrylate, tridecyl acrylate, tetradecyl acrylate, hexadecyl acrylate, octadecyl acrylate, and eicosyl acrylate.

The alkyl acrylates such as the monomers represented by the above-described chemical formula may be straight chain or branched alkyl acrylates.

The acrylic polymer contains a hydroxyl group-containing monomer that is copolymerizable with the acrylic acid ester as an essential component. Examples of the hydroxyl group-containing monomer include 2-hydroxyethyl(meth) acrylate, 2-hydroxypropyl(meth) acrylate, 4-hydroxybuty (meth) acrylate, 6-hydroxyhexyl(meth)acrylate, 8-hydroxyoctyl (meth)acrylate, 10-hydroxydecyl(meth)acrylate, 12-hydroxylauryl (meth)acrylate, and 4-hydroxymethylcyclohexyl methyl(meth)acrylate. These monomers may be used either alone or in combination of two or more kinds of them.

The content of the hydroxyl group-containing monomer is preferably in a range of 1 to 30% by weight, and more preferably in a range of 3 to 10% by weight to all the monomer components. When the content is less than 1% by weight, the cohesive force of the pressure-sensitive adhesive decreases, and the pickup property may deteriorate. On the other hand, when the content exceeds 30% by weight, peeling becomes difficult because polarity of the pressure-sensitive adhesive becomes high and the interaction with the die bond film becomes strong.

The acrylic polymer may include a unit corresponding to other monomer components that are copolymerizable with the acrylic acid ester or the hydroxyl group-containing monomer as necessary for the purpose of modifying the cohesive force and the heat resistance. Examples of such other monomer components include methacrylic acid esters such as methyl methacrylate, ethyl methacrylate, propyl methacrylate, isopropyl methacrylate, butyl methacrylate, isobutyl methacrylate, s-butyl methacrylate, and t-butyl methacrylate; acid anhydride monomers such as maleic anhydride and itaconic anhydride; sulfonic acid group-containing monomers such as styrenesulfonic acid, allylsulfonic acid, 2-(meth) acrylamide-2-methylpropanesulfonic acid, (meth) acrylamidepropanesulfonic acid, sulfopropyl(meth)acrylate, and (meth) acryloyloxynaphthalenesulfonic acid; phosphate group-containing monomers such as 2-hydroxyethylacryloylphosphate; styrene monomers such as styrene, vinyltoluene, and α-methylstyrene; olefins or dienes such as ethylene, butadiene, isoprene, and isobutylene; halogen atom-containing monomers such as vinyl chloride; fluorine atom-containing monomers such as fluorine (meth)acrylate; acrylamide; and acrylonitrile.

As described above, it is preferable that the acrylic polymer does not include a carboxyl group-containing monomer. If the acrylic polymer includes a carboxyl group-containing monomer, the tackiness between the pressure-sensitive adhesive layer 14 and the die bond film 10 becomes large and the peeling properties of both the pressure-sensitive adhesive layer 14 and the die bond film 10 deteriorate because the carboxyl group and the epoxy group of the epoxy resin in the die bond film 10 react with each other. Examples of such a carboxyl group-containing monomer include acrylic acid, methacrylic acid, carboxyethyl (meth) acrylate, carboxypentyl(meth) acrylate, itaconic acid, maleic acid, fumaric acid, and crotonic acid.

The acrylic polymer can be obtained by polymerizing a single monomer or a monomer mixture of two or more kinds of monomers. The polymerization can be performed by any method such as solution polymerization (for example, radical polymerization, anionic polymerization, and cationic polymerization), emulsion polymerization, bulk polymerization, suspension polymerization, and photopolymerization (for example, ultraviolet (UV) polymerization). The content of a low molecular weight substance is preferably small from the viewpoint of prevention of contamination to a clean adherend. From this viewpoint, the number average molecular weight of the acrylic polymer is preferably about 350,000 to 1,000,000, and more preferably about 450,000 to 800,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The pressure-sensitive adhesive may be blended not only with the components described above but also with a wide variety of conventionally known additives such as a tackifier, and aging inhibitor, if necessary.

Examples of the ultraviolet curable monomer component to be compounded include such as an urethane oligomer, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth) acrylate. Further, the ultraviolet curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the ultraviolet ray curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type ultraviolet curable pressure sensitive adhesive described above, the ultraviolet curable pressure sensitive adhesive includes an internal ultraviolet curable pressure sensitive adhesive using an acryl polymer having a radical reactive carbon-carbon double bond in the polymer side chain, in the main chain, or at the end of the main chain as the base polymer. The internal ultraviolet curable pressure sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with anyone of the hydroxyl-containing monomers exemplified above, or an ether compound such as 2-hydroxyethyl vinyl ether, 4-hydroxybutyl vinyl ether or diethylene glycol monovinyl ether.

The intrinsic type radial ray curable adhesive may be made only of the above-mentioned base polymer (in particular, the acrylic polymer), which has a carbon-carbon double bond.

However, the above-mentioned radial ray curable monomer component or oligomer component may be incorporated into the base polymer to such an extent that properties of the adhesive are not deteriorated. The amount of the radial ray curable oligomer component or the like is usually 30 parts or less by weight, preferably from 0 to 10 parts by weight for 100 parts by weight of the base polymer.

In the case that the radial ray curable adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the ultraviolet curing type pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The method of forming the part 14a in the pressure-sensitive adhesive layer 14 includes a method of forming the ultraviolet curable pressure-sensitive adhesive layer 14 on the base material 13 and then radiating the part 14a with ultraviolet partially and curing. The partial ultraviolet irradiation can be performed through a photo mask in which a pattern is formed which is corresponding to a part 14b, etc. other than the part 14a. Further, examples include a method of radiating in a spot manner and curing, etc. The formation of the ultraviolet curable pressure-sensitive adhesive layer 14 can be performed by transferring the pressure-sensitive adhesive layer provided on a separator onto the base material 13. The partial ultraviolet curing can be also performed on the ultraviolet curable pressure-sensitive adhesive layer 14 provided on the separator.

In the pressure-sensitive adhesive layer 14 of the dicing die bond film 11, the ultraviolet irradiation may be performed on a part of the pressure-sensitive adhesive layer 14 so that the adhesive strength of the part 14a becomes smaller than the adhesive strength of other parts 14b. That is, the part 14a in which the adhesive strength is decreased can be formed by using those in which the entire or a portion of the part other than the part corresponding to the part 14a on at least one face of the base material 13 is shaded, forming the ultraviolet curable pressure-sensitive adhesive layer 14 onto this, then radiating ultraviolet, and curing the part corresponding the part 14a. The shading material that can be a photo mask on a supporting film can be manufactured by printing, vapor deposition, etc. Accordingly, the dicing die bond film 10 of the present invention can be produced with efficiency.

The adhesive power of the portion 14a of the pressure-sensitive adhesive layer 14 in the dicing die bond film 11 to the first adhesive layer 1 is preferably designed to be smaller than that of the portion 14b to the dicing ring. The adhesive power of the portion 14a to the first adhesive layer 1 is preferably 0.5 N/20 mm or less, more preferably 0.01 to 0.42 N/20 mm, and further preferably 0.01 to 0.35 N/20 mm. On the other hand, the adhesive power of the portion 14b to the dicing ring is preferably 0.5 to 20 N/20 mm. Even if the portion 14a has a weak peel adhesive power, generation of chip fly can be suppressed by the adhesive power of the portion 14b, and a sufficient holding power for processing a wafer can be exhibited. These adhesive powers are based on the values measured at a normal temperature (23° C.), a peeling angle of 90 degrees, and a tensile (peeling) speed of 300 mm/min.

The adhesive power of the portion 14a of the pressure-sensitive adhesive layer 14 in the dicing die bond film 11' to the first adhesive layer 1 is preferably designed to be smaller than that of the portion 14b to a portion 1b that is different from a semiconductor wafer pasting portion 1a. The adhesive power of the portion 14a based on the adhesive power (peeling angle: 90 degrees, peeling speed: 300 mm/min) at a normal temperature (23° C.) is preferably 0.01 to 0.2 N/20 mm from the viewpoint of fixing and holding power of the wafer and a collecting property of a formed chip. When the adhesive power is less than 0.01 N/20 mm, chip fly may occur during dicing because adhesion and fixing of a semiconductor element is insufficient. When the adhesive power exceeds 0.2 N/20 mm, pickup of the semiconductor element may be difficult because the pressure-sensitive adhesive layer 14 adheres to the first adhesive layer 1 excessively.

Further, the adhesive power of the second adhesive layer 2 in the dicing die bond films 11 and 11' to a semiconductor wafer is preferably designed to be larger than that of the first adhesive layer 1 to the portion 14a. The adhesive power to a semiconductor wafer is appropriately adjusted according to its kind. The adhesive power of the first adhesive layer 1 to the portion 14a (normal temperature (23° C.), peeling angle: 90 degrees, peeling speed: 300 mm/min) is preferably 0.5 N/20 mm or less, more preferably 0.01 to 0.42 N/20 mm, and further preferably 0.01 to 0.35 N/20 mm. On the other hand, the adhesive power of the second adhesive layer 2 to a semiconductor wafer (normal temperature (23° C.), peeling angle: 90 degrees, peeling speed: 300 mm/min) is preferably 10 to 50 N/20 mm or less, and more preferably 10 to 30 N/20 mm from the viewpoint of reliability during dicing, pickup, and die bonding and the pickup property.

When inhibition of curing due to oxygen occurs during irradiation with an ultraviolet ray, it is desirable to shield oxygen (air) from the surface of the ultraviolet ray curing-type pressure-sensitive adhesive layer 14. Examples of the shielding method include a method of covering the surface of the pressure-sensitive adhesive layer 14 with a separator and a method of performing irradiation with an ultraviolet ray in a nitrogen gas atmosphere.

The thickness of the pressure-sensitive adhesive layer 14 is not especially limited. However, it is preferably about 1 to 50 μm from the viewpoint of prevention of cracking of the chip cut surface and compatibility of fixing and holding of the adhesive layer. It is preferably 2 to 30 μm, and further preferably 5 to 25 μm. The pressure-sensitive adhesive layer 14 may be a single layer or may be a one obtained by laminating a plurality of layers.

The shear storage modulus of the pressure-sensitive adhesive layer 14 is preferably $5\times10^4$ to $1\times10^{10}$ Pa, and more preferably $1\times10^5$ to $1\times10^8$ Pa at 23° C. and 150° C. When the shear storage modulus is less than $5\times10^4$ Pa, peeling of the pressure-sensitive adhesive layer 14 from the die bond films 10 and 10' may become difficult. On the other hand, when the shear storage modulus exceeds $1\times10^{10}$ Pa, adhesion between the pressure-sensitive adhesive layer 14 and the die bond films 10 and 10' may deteriorate. The shear storage modulus of the pressure-sensitive adhesive layer 14 is a value obtained as follows. First, the pressure-sensitive adhesive layer is made into a cylindrical shape of about 1.5 mm in thickness and 7.9 mm in diameter. Next, using an ARES viscoelasticity measurement apparatus manufactured by Rheometric Scientific FE, Ltd. as a dynamic viscoelasticity measurement apparatus, each of the pressure-sensitive adhesive layers is installed in a jig of a parallel plate, and the temperature is changed from 23° C. to 150° C. at a temperature rise rate of 5° C./min while applying shear strain of 1 Hz in frequency. The tensile storage modulus at 23° C. and 150° C. can be obtained by measuring the modulus at this time. If the pressure-sensitive adhesive layer 14 is of a radiation curing type, the value of the tensile storage modulus is the value after the radiation curing. The tensile storage modulus can be appropriately adjusted by adding an external crosslinking agent.

The pressure-sensitive adhesive layer 14 may contain various additives such as a coloring agent, a thickener, an extender, a filler, a tackifier, a plasticizer, an antiaging agent, an antioxidant, a surfactant, and a crosslinking agent unless the effects of the present invention are not spoiled.

The dicing die bond film 10 according to the present embodiment can be produced in the following manner.

First, the base 13 is formed by a conventionally known film forming method. Examples of the film forming method include a calender film forming method, a casting method in an organic solvent, an inflation extrusion method in a closed system, a T die extrusion method, a coextrusion method, and a dry lamination method.

Next, the pressure-sensitive adhesive layer 14 is formed by applying a pressure-sensitive adhesive composition onto the base 13 and drying (crosslinking as necessary) the composition. Examples of the application method include roll coating, screen coating, and gravure coating. Further, the pressure-sensitive adhesive composition may be directly applied to the base 13, or may be applied onto peeling paper to the surface of which a peeling treatment has been performed and then transferred to the base 13.

Then, the die bond film 10 and the dicing film 12 are pasted to each other so that the first adhesive layer 1 in the die bond film 10 and the pressure-sensitive adhesive layer 14 serve as a pasting surface. The die bond film 10 is pasted to the pasting portion 14a of the die bond film in the pressure-sensitive adhesive layer 14. With this configuration, the dicing die bond film 10 according to the present embodiment can be obtained.

(Method of Manufacturing a Semiconductor Device)

Figure 3:
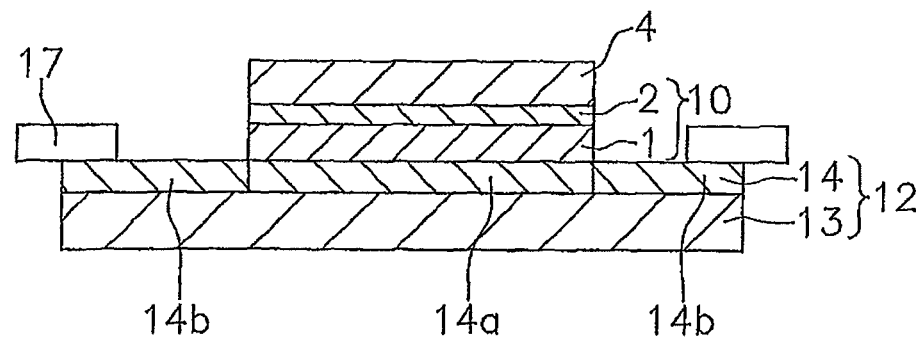
FIG. 3 is a schematic sectional drawing showing the state in which a semiconductor wafer is mounted on the dicing die bond film.

Next, a method of manufacturing a semiconductor device using the dicing die bond film 11 according to the present embodiment is explained. The dicing die bond film 11 according to the present embodiment can be preferably used when a plurality of semiconductor chips are three-dimensionally mounted on an adherend by lamination. In more detail, the dicing die bond film 11 is preferably used when mounting, onto a semiconductor chip that is die-bonded onto an adherend and that is electrically connected to the adherend by a bonding wire, another semiconductor chip (FoW (Film on Wire)). A case of three-dimensionally mounting a plurality of semiconductor chips is explained below as an example. FIG. 3 is a schematic sectional drawing showing an example in which a semiconductor element is mounted by interposing a die bond film therebetween.

First, a semiconductor wafer 4 is press bonded onto the second adhesive layer 2 in the dicing die bond film 11 and fixed thereto by adhesion and holding as shown in FIG. 3 (a mounting step). The present step is performed while pressing the semiconductor wafer 4 with a pressing means such as a pressure roll. The temperature during press bonding is appropriately set as necessary, and is normally preferably in a range of 40 to 100° C. The pressure is also appropriately set as necessary, and is normally preferably in a range of 0.1 to 1 MPa. Moreover, a dicing ring 17 is pasted on the peripheral parts of the pressure-sensitive adhesive layer 14 of the dicing die bond film 11 on which the semiconductor wafer 4 is pasted.

Figure 4:
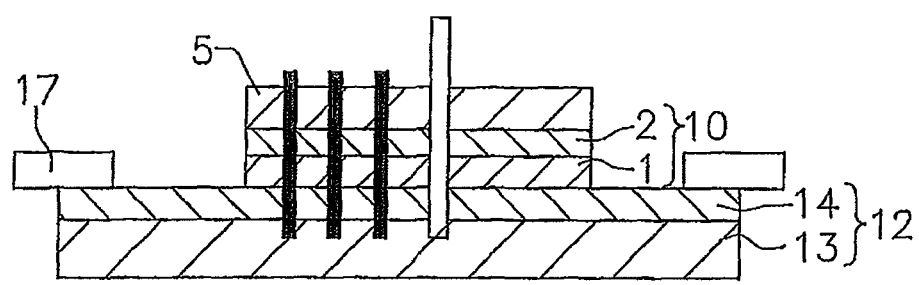
FIG. 4 is a schematic sectional drawing showing the state of dicing the semiconductor wafer.

Next, dicing of the semiconductor wafer 4 is performed (a dicing step) as shown in FIG. 4. With this step, another semiconductor chip 5 is formed by cutting and individualizing the semiconductor wafer 4 into a prescribed size. The dicing can be performed from the circuit surface side of the semiconductor wafer 4 by a normal method, for example. The cutting is preferably performed so that the cut depth reaches the dicing film 12. The dicing apparatus that is used in the present step is not especially limited, and a conventionally known apparatus can be used. Because the semiconductor chip 5 is adhered and fixed by the dicing die bond film 11 even after cutting, chip cracking and chip fly can be suppressed and damage of the semiconductor chip 5 can be decreased.

Pickup is performed to peel off the semiconductor chip 5 that is adhered and fixed to the dicing die bond film 11 together with the die bond film 10 (the first adhesive layer 1 and the second adhesive layer 2) from the dicing film (a pickup step). The method of pickup is not especially limited, and various conventionally known methods can be adopted. An example thereof is a method of pushing up the individual semiconductor chip 5 from the side of the dicing die bond film 11 by a needle and picking up the pushed semiconductor chip 5 by using a pickup apparatus. The pickup condition can be appropriately set as necessary. Further, the pickup can be performed without irradiating the pressure-sensitive adhesive layer 14 with an ultraviolet ray because the pasting portion 14a of the die bond film in the pressure-sensitive adhesive layer 14 is cured with an ultraviolet ray in advance. However, the pickup may be performed by further reducing the adhesive power to the die bond film by irradiating the pressure-sensitive adhesive layer 14 with an ultraviolet ray.

Figure 5:
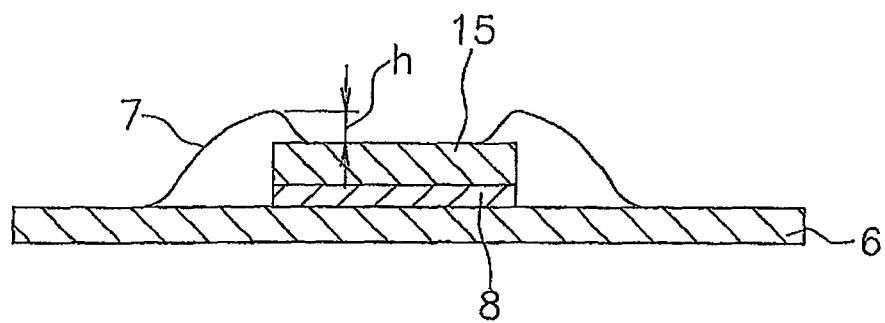
FIG. 5 is a schematic sectional drawing showing a semiconductor element that is die-bonded onto an adherend.
Figure 6:
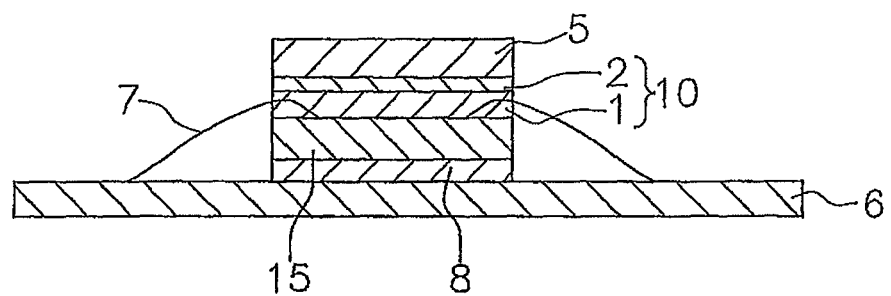
FIG. 6 is a schematic sectional drawing showing the state of die bonding another semiconductor element on the semiconductor element by interposing the die bond film therebetween.

Next, the semiconductor chip 5 with a die bond film is die-bonded onto a semiconductor chip 15 that is already die-bonded onto an adherend 6 using another die bond film 8 (a die bonding step) as shown in FIGS. 5 and 6. The die bonding step is performed by press bonding so that a portion of the bonding wire 7 is buried inside of the first adhesive layer 1. Because the die bond film 10 has the second adhesive layer 2, the bonding wire 7 does not contact with the backside of the semiconductor chip 5. The die bonding condition can be appropriately set as necessary. However, the die bonding can be normally performed at a die bonding temperature of 80 to 160° C., a bonding pressure of 0.05 to 1 MPa, and a bonding time of 0.1 to 10 seconds.

Then, the semiconductor chip 5 is adhered onto the semiconductor chip 15 by thermally curing the die bond film 10 by a heat treatment (a thermal curing step). The condition of the heat treatment is a temperature of 80 to 180° C. and a heating time of 0.1 to 24 hours, preferably 0.1 to 4 hours, and more preferably 0.1 to 1 hour.

Next, a wire bonding step of electrically connecting the tip of a terminal part (inner lead) of the adherend 6 and an electrode pad (not shown in the drawings) on the semiconductor chip 5 by the bonding wire 7 is performed. Examples of the bonding wire 7 include a gold wire, an aluminum wire, and a copper wire. The temperature when performing the wire bonding is 80 to 250° C. and preferably in a range of 80 to 220° C. The heating time is a few seconds to a few minutes. The wiring can be performed by using vibration energy due to ultrasonic waves and pressure bonding energy due to the applied pressure while heating the atmosphere to a temperature in the above-described range.

The shear adhering strength of the die bond film. 10 after thermal curing is preferably 0.01 MPa or more, and more preferably 0.01 to 5 MPa at 175° C. By making the shear adhering strength at 175° C. after thermal curing be 0.01 MPa or more, shear deformation at the adhering surface of the die bond film 10 and the semiconductor chip 5 or the adherend 6 caused by ultrasonic vibration and heating during the wire bonding step can be prevented from occurring. That is, the success rate of the wire bonding can be prevented from decreasing because the semiconductor element does not move by the ultrasonic vibration during wire bonding.

Here, the wire bonding step may be performed without thermally curing the die bond film 10 in the thermal curing step. In this case, the shear adhering strength of the die bond film 10' at 25° C. is preferably 0.2 MPa or more, and more preferably 0.2 t10 MPa to the semiconductor chip 15 as described above. With this configuration, even when the wire bonding step is performed without completely thermally curing the die bond film 10, shear deformation does not occur at the adhering surface of the die bond film 10 and the semiconductor chip 5 or the adherend 6 due to ultrasonic vibration and heating in this step. That is, the success rate of the wire bonding can be prevented from decreasing because the semiconductor element does not move by the ultrasonic vibration during wire bonding. Moreover, the uncured die bond film. 10 is not completely thermally cured even when the wire bonding step is performed.

Figure 7:
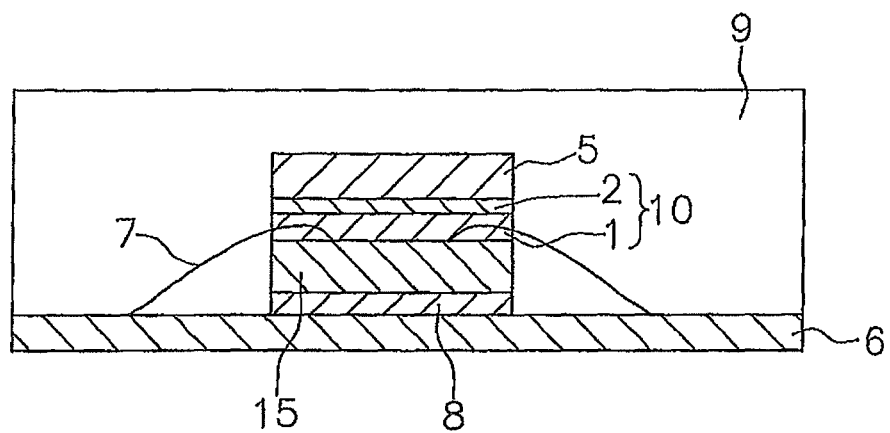
FIG. 7 is a schematic sectional drawing showing the state of sealing the semiconductor element and the other semiconductor element with a resin.
Figure 8:
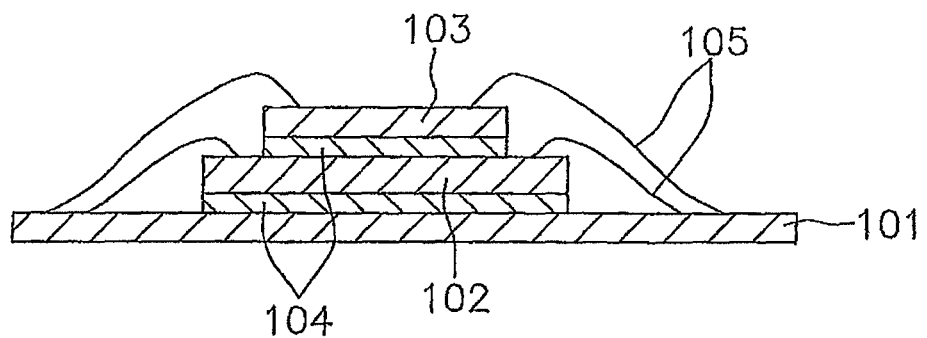
FIGS. 8A and 8B are schematic sectional drawings showing an example in which, on a semiconductor chip, another semiconductor chip is three-dimensionally mounted using a conventional die bond film.
Figure 8:
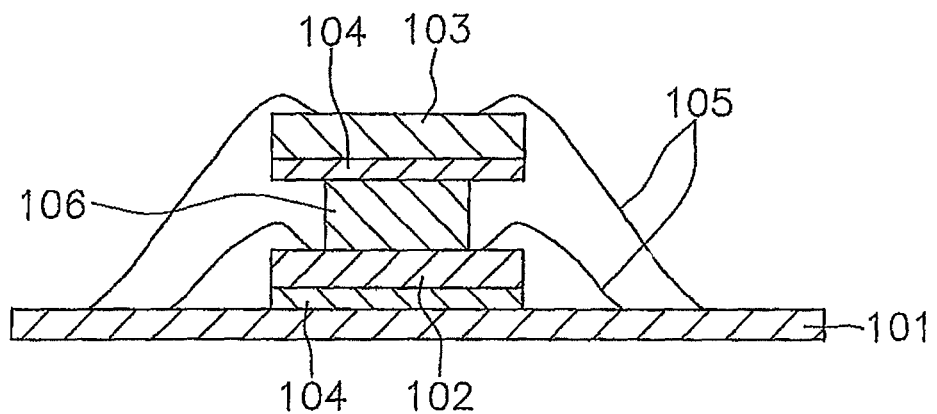

Then, the semiconductor chip 15 and the like are sealed with a sealing resin 9 (a sealing step) as shown in FIG. 7. The present step is performed so as to protect the semiconductor chip 15 and the like that are mounted on the adherend 6 and the bonding wire 7. The present step is performed by molding a sealing resin by using a mold. An epoxy resin is used as the sealing resin 9, for example. The resin sealing is usually performed at a heating temperature of 175° C. for 60 to 90 seconds. However, the present invention is not limited to this, and curing can be performed at 165 to 185° C. for a few minutes. With this operation, the sealing resin is cured and the die bond film 10 is also thermally cured when it has not been thermally cured. That is, in the present invention, the die bond film 10 can be thermally cured and adhered in the present step even if the post curing step that is described later is not performed, and the number of manufacturing steps can be reduced and the manufacturing period of a semiconductor device can be made shorter.

The sealing resin 9 that is not cured sufficiently in the sealing step is completely cured in the post curing step. Even if the die bond film 10 is not thermally cured in the sealing step, the die bond film 10 is thermally cured together with the curing of the sealing resin 9 and can be adhered and fixed. The heating temperature in the present step varies with the kinds of the sealing resin. However, it is in a range of 165 to 185° C., and the heating time is about 0.5 to 8 hours, for example.

EXAMPLES

The present invention is explained in detail using preferred examples below. However, the materials, the compounded amount, and the like described in the examples do not limit the scope of the present invention as long as there is no particular restrictive description. Further, "parts" in the examples means parts by weight.

Example 1

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 242 parts of an epoxy resin A (trade name: Epicoat 1004 manufactured by Japan Epoxy Resin Co., Ltd.), 220 parts of an epoxy resin B (trade name: Epicoat 827 manufactured by Japan Epoxy Resin Co., Ltd.), 489 parts of a phenol resin (trade name: Milex XLC-4L manufactured by Mitsui Chemicals, Inc.), 660 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment filmA (a peeling liner) made of a polyethylene terephthalate film having a thickness of 50 µm on which a silicone release treatment was performed, and then dried at 130° C. for 2 minutes. With this operation, a first adhesive layer having a thickness of 60 µm was produced.

[Production of the Second Adhesive Layer]

A second adhesive composition with a concentration of 23.6% by weight was prepared by dissolving 10 parts of a dicyclopentadiene type epoxy resin (trade name: EPICLON HP-7200H manufactured by DIC Corporation), 10 parts of a phenol resin (trade name: Milex XLC-4L manufactured by Mitsui Chemicals, Inc.), 100 parts of an acrylate polymer as an acrylic resin (trade name: SG-80H manufactured by Nagase ChemteX Corporation), and 63 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 µm on which a silicone release treatment was performed, and then dried at 130° C. for 2 minutes. With this operation, a second adhesive layer having a thickness of 10 µm was produced.

[Production of The Die Bond Film]

A die bond film having a thickness of 70 µm was formed between the release treatment filmA and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 2

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 53 parts of an epoxy resin A (trade name: Epicoat 1004 manufactured by Japan Epoxy Resin Co., Ltd.), 56 parts of an epoxy resin B (trade name: Epicoat 827 manufactured by Japan Epoxy Resin Co., Ltd.), 146 parts of a phenol resin (trade name: Milex XLC-4L manufactured by Mitsui Chemicals, Inc.), 150 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment film A (a peeling liner) made of a polyethylene terephthalate film having a thickness of 50 μm on which a silicone release treatment was performed, and then dried at 130° C. for 2 minutes. With this operation, a first adhesive layer having a thickness of 60 μm was produced.

[Production of the Second Adhesive Layer]

A second adhesive composition with a concentration of 23.6% by weight was prepared by dissolving 20 parts of a dicyclopentadiene type epoxy resin (trade name: EPICLON HP-7200H manufactured by DIC Corporation), 16 parts of a phenol resin (trade name: Milex XLC-4L manufactured by Mitsui Chemicals, Inc.), 100 parts of an acrylate polymer as an acrylic resin (trade name: SG-80H manufactured by Nagase ChemteX Corporation), and 60 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 3

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 33 parts of an epoxy resin A (trade name: Epicoat 1004 manufactured by Japan Epoxy Resin Co., Ltd.), 36 parts of an epoxy resin B (trade name: Epicoat 827 manufactured by Japan Epoxy Resin Co., Ltd.), 76 parts of a phenol resin (trade name: Milex XLC-4L manufactured by Mitsui Chemicals, Inc.), 100 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment film A (a peeling liner) made of a polyethylene terephthalate film having a thickness of 50 μm on which a silicone release treatment was performed, and then dried at 130° C. for 2 minutes. With this operation, a first adhesive layer having a thickness of 60 μm was produced.

[Production of the Second Adhesive Layer]

A second adhesive composition with a concentration of 23.6% by weight was prepared by dissolving 44 parts of a dicyclopentadiene type epoxy resin (trade name: EPICLON HP-7200H manufactured by DIC Corporation), 54 parts of a phenol resin (trade name: Milex XLC-4L manufactured by Mitsui Chemicals, Inc.), 100 parts of an acrylate polymer as an acrylic resin (trade name: SG-80 H manufactured by Nagase ChemteX Corporation), and 100 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 4

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 242 parts of an epoxy resin A (trade name: Epicoat 1004 manufactured by Japan Epoxy Resin Co., Ltd.), 220 parts of an epoxy resin B (trade name: Epicoat 827 manufactured by Japan Epoxy Resin Co., Ltd.), 489 parts of a phenol resin (trade name: Milex XLC-4L manufactured by Mitsui Chemicals, Inc.), 660 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment film A (a peeling liner) made of a polyethylene terephthalate film having a thickness of 50 μm on which a silicone release treatment was performed, and then dried at 130° C. for 2 minutes. With this operation, a first adhesive layer having a thickness of 60 μm was produced.

[Production of the Second Adhesive Layer]

A second adhesive composition with a concentration of 23.6% by weight was prepared by dissolving 100 parts of an acrylate polymer as an acrylic resin (trade name: SG-80H manufactured by Nagase ChemteX Corporation), and 50 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 5

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 23 parts of an epoxy resin A (trade name: Epicoat 1004 manufactured by Japan Epoxy Resin Co., Ltd.), 26 parts of an epoxy resin B (trade name: Epicoat 827 manufactured by Japan Epoxy Resin Co., Ltd.), 52 parts of a phenol resin (trade name: Milex XLC-4L manufactured by Mitsui Chemicals, Inc.), 120 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment film A (a peeling liner) made of a polyethylene terephthalate film having a thickness of 50 μm on which a silicone release treatment was performed, and then dried at 130° C. for 2 minutes. With this operation, a first adhesive layer having a thickness of 60 μm was produced.

[Production of the Second Adhesive Layer]

A second adhesive composition with a concentration of 23.6% by weight was prepared by dissolving 10 parts of a dicyclopentadiene type epoxy resin (trade name: EPICLON HP-7200H manufactured by DIC Corporation), 10 parts of a phenol resin (trade name: Milex XLC-4L manufactured by Mitsui Chemicals, Inc.), 100 parts of an acrylate polymer as an acrylic resin (trade name: SG-80H manufactured by Nagase ChemteX Corporation), and 63 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 6

[Production of the First Adhesive Layer]

A first adhesive composition with a concentration of 23.6% by weight was prepared by dissolving 100 parts of an acrylate polymer having ethyl acrylate-methyl methacrylate as a main component (trade name: Paracron W-197CM manufactured by Negami Chemical Industrial Co., Ltd.), 242 parts of an epoxy resin A (trade name: Epicoat 1004 manufactured by Japan Epoxy Resin Co., Ltd.), 220 parts of an epoxy resin B (trade name: Epicoat 827 manufactured by Japan Epoxy Resin Co., Ltd.), 489 parts of a phenol resin (trade name: Milex XLC-4L manufactured by Mitsui Chemicals, Inc.), 660 parts of spherical silica having an average particle size of 500 nm (trade name: SO-25R manufactured by Admatechs Co., Ltd.), and 3 parts of 2-undecylimidazole as a thermosetting catalyst (trade name: C11-Z manufactured by Shikoku Chemicals Corporation) in methyl ethyl ketone.

The first adhesive composition solution was applied onto a release treatment film A (a peeling liner) made of a polyethylene terephthalate film having a thickness of 50 μm on which a silicone release treatment was performed, and then dried at 130° C. for 2 minutes. With this operation, a first adhesive layer having a thickness of 60 μm was produced.

[Production of the Second Adhesive Layer]

A second adhesive composition with a concentration of 23.6% by weight was prepared by dissolving 80 parts of a dicyclopentadiene type epoxyresin (trade name: EPICLON HP-7200H manufactured by DIC Corporation), 86 parts of a phenol resin (trade name: Milex XLC-4L manufactured by Mitsui Chemicals, Inc.), 100 parts of an acrylate polymer as an acrylic resin (trade name: SG-80H manufactured by Nagase ChemteX Corporation), and 60 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 7

[Production of the First Adhesive Layer]

The same first adhesive layer as in Example 1 was used as the first adhesive layer according to the present example.

[Production of the Second Adhesive Layer]

The second adhesive layer according to the present example was formed on the release treatment film B in the same manner as in Example 1 except that the thickness was changed to 30 μm.

[Production of the Die Bond Film]

A die bond film having a thickness of 90 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 8

[Production of the First Adhesive Layer]

The same first adhesive layer as in Example 1 was used as the first adhesive layer according to the present example.

[Production of the Second Adhesive Layer]

The second adhesive layer according to the present example was formed on the release treatment film B in the same manner as in Example 1 except that the thickness was changed to 5 μm.

[Production of the Die Bond Film]

A die bond film having a thickness of 65 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 9

[Production of the First Adhesive Layer]

The same first adhesive layer as in Example 1 was used as the first adhesive layer according to the present example.

[Production of the Second Adhesive Layer]

The second adhesive layer according to the present example was formed on the release treatment film B in the same manner as in Example 1 except that the thickness was changed to 2 μm.

[Production of the Die Bond Film]

A die bond film having a thickness of 62 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 10

[Production of the First Adhesive Layer]

The same first adhesive layer as in Example 1 was used as the first adhesive layer according to the present example.

[Production of the Second Adhesive Layer]

The second adhesive layer according to the present example was formed on the release treatment film B in the same manner as in Example 1 except that the thickness was changed to 60 μm.

[Production of the Die Bond Film]

A die bond film having a thickness of 120 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 11

[Production of the First Adhesive Layer]

The same first adhesive layer as in Example 1 was used as the first adhesive layer according to the present example. mple 1.

[Production of the Second Adhesive Layer]

A second adhesive composition with a concentration of 23.6% by weight was prepared by dissolving 10 parts of a dicyclopentadiene type epoxy resin (trade name: EPICLON HP-7200H manufactured by DIC Corporation), 10 parts of a phenol resin (trade name: Milex XLC-4L manufactured by Mitsui Chemicals, Inc.), 100 parts of an acrylate polymer as an acrylic resin (trade name: SG-80H manufactured by Nagase ChemteX Corporation), 0.5 parts of a dye (trade name: OIL RED 330 manufactured by Orient Chemical Industries Co., Ltd.), and 63 parts of spherical silica (trade name: SO-25R manufactured by Admatechs Co., Ltd.) in methyl ethyl ketone.

The second adhesive composition solution was applied onto a release treatment film B (a peeling liner) made of a polyethylene terephthalate film having a thickness of 50 μm on which a silicone release treatment was performed, and then dried at 130° C. for 2 minutes. With this operation, a second adhesive layer having a thickness of 10 μm was produced.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting conditions were a temperature of 80° C., a pasting pressure of 0.3 MPa, and a lamination speed of 10 mm/sec.

Example 12

[Production of the First Adhesive Layer]

The same first adhesive layer as in Example 1 was used as the first adhesive layer according to the present example.

[Production of the Second Adhesive Layer]

The second adhesive layer according to the present example was formed in the same manner as in Example 11 except that a dye (trade name: OIL BLUE 630 manufactured by Orient Chemical Industries Co., Ltd.) was used.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film. B together so that the first adhesive layer and the second adhesive layer serve as a pasting surface. The pasting condition were the same as in Example 1.

Example 13

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 11 except that a dye (trade name: OIL YELLOW 129 manufactured by Orient Chemical Industries Co., Ltd.) was used.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film. B together so that the first adhesive layer and the second adhesive layer serve as a pasting surface. The pasting condition were the same as in Example 1.

Example 14

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 11 except that a dye (trade name: OIL GREEN 502 manufactured by Orient Chemical Industries Co., Ltd.) was used.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 15

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 11 except that the dye was not added and 63 parts of carbon black (trade name: NAF5091 Black manufactured by Dainichiseika Color & Chemicals Mfg. Co., Ltd.) was added as a filler.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film. B together so that the first adhesive layer and the second adhesive layer serve as a pasting surface. The pasting condition were the same as in Example 1.

Example 16

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 15 except that an alumina filler (trade name: DAM-03 manufactured by Denki Kagaku Kogyo KK) was used as a filler.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film. B together so that the first adhesive layer and the second adhesive layer serve as a pasting surface. The pasting condition were the same as in Example 1.

Example 17

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 15 except that a nickel filler (trade name: SPQ03S manufactured by Mitsui Mining & Smelting Co., Ltd.) was used as a filler.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 18

[Production of the First Adhesive Layer]
The same first adhesive layer as in Example 1 was used as the first adhesive layer according to the present example.
[Production of the Second Adhesive Layer]
The second adhesive layer according to the present example was formed in the same manner as in Example 15 except that a copper filler (trade name: 1110 manufactured by Mitsui Mining & Smelting Co., Ltd.) was used as a filler.
[Production of the Die Bond Film]
A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 19

[Production of the First Adhesive Layer]
The same first adhesive layer as in Example 1 was used as the first adhesive layer according to the present example.

[Production of the Second Adhesive Layer]

The second adhesive layer according to the present example was formed in the same manner as in Example 15 except that a titanium oxide filler (trade name: E-56 White manufactured by Dainichiseika Color & Chemicals Mfg. Co., Ltd.) was used as a filler.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

Example 20

[Production of the First Adhesive Layer]

The same first adhesive layer as in Example 1 was used as the first adhesive layer according to the present example.

[Production of the Second Adhesive Layer]

The second adhesive layer according to the present example was formed in the same manner as in Example 15 except that no filler was added.

[Production of the Die Bond Film]

A die bond film having a thickness of 70 μm was formed between the release treatment film A and the release treatment film B by pasting the first adhesive layer that was formed on the release treatment film A and the second adhesive layer that was formed on the release treatment film B together so that the first adhesive layer and the second adhesive layer serve as a pasting surface. The pasting condition were the same as in Example 1.

(Measurement of the Shear Loss Modulus G")

The shear loss modulus G" at 120° C. before thermal curing was measured for each of the first adhesive layer and the second adhesive layer in the die bond film produced in each of the examples. A solid viscoelasticity measurement apparatus (ARES manufactured by Rheometric Scientific FE, Ltd.) was used in the measurement. A sample of 10 mm square and 1 mm thick was produced, and the shear loss modulus G" at 25 to 300° C. was obtained for each sample. The results are shown in Tables 1 to 4.

(Tensile Storage Modulus at 175° C. after Thermal Curing)

Each of the die bond films that were produced in the examples was thermally cured by a heat treatment at 175° C. for 5 hours. Next, a rectangular sample 40 mm in length and 10 mm in width was cut from each of the die bond films after thermal curing with a cutting knife. The tensile storage modulus at 75° C. was obtained by measuring the tensile storage modulus at −50 to 300° C. of each sample under a condition of temperature rise rate of 10° C./min and a frequency of 1 MHz using a solid viscoelasticity measurement apparatus (RSA III manufactured by Rheometric Scientific FE, Ltd.).

(Thickness of the Die Bond Film)

The cross section of the first adhesive layer and the second adhesive layer in each of the die bond films produced in the examples was observed with a SEM, and the value of $d_1/(d_1+d_2)$ was calculated by measuring the thickness $d_1$ (μm) of the first adhesive layer and the thickness $d_2$ (μm) of the second adhesive layer.

(180-Degree Peeling Strength of the Die Bond Film and the Semiconductor Wafer)

The 180-degree peeling strength of the first adhesive layer or the second adhesive layer that was produced in each of the examples and the semiconductor wafer was measured by following JIS Z 0237. First, the first adhesive layer or the second adhesive layer was backed with a pressure-sensitive adhesive tape (trade name: BT-315 manufacturedby Nitto Denko Corporation) by pasting the tape thereto. Next, a rectangular sample 100 mm in length×10 mm in width was cut out and pasted to the backside of the semiconductor wafer on a hot plate of 50° C. A test piece was produced by performing the pasting by moving a roller of 2 kg back and forth once and leaving the semiconductor wafer for 20 minutes under a normal temperature atmosphere. Next, the pasted semiconductor wafer was fixed, and the 180-degree peeling strength was measured for each test piece under a condition of a peeling angle of 180 degrees and a peeling speed of 30 mm/min using a tensile tester (trade name: AGS-H manufactured by Shimadzu Corporation).

(Contact Evaluation of the Bonding Wire)

First, a BGA substrate (pad pitch for wire bonding: 60 μm) was prepared as an adherend, that was coated with a solder resist (trade name: AUS308 manufactured by Taiyo Ink Mfg. Co., Ltd.) and having bismaleimide triazine as a main component.

Next, the semiconductor chip was die-bonded onto the BGA substrate using the first adhesive layer. That is, the first adhesive layer that was produced in each of the examples was pasted to the backside of the semiconductor chip at a temperature of 40° C. Next, the semiconductor chip was die-bonded onto the BGA substrate under a condition of a die bonding temperature of 150° C., a bonding pressure of 0.1 MPa, and a bonding time of 3 seconds. The semiconductor chip was used on which aluminum was deposited in a thickness of 100 μm and having a chip size of 5 mm×5 mm. After die bonding, a heat treatment at 120° C. for 8 hours was performed using a dryer. With this operation, the first adhesive layer was thermally cured.

Next, a wire bonding step was performed so as to electrically connect a pad for wire bonding of the BGA substrate and the semiconductor chip. Eagle 60 (trade name) manufactured by ASM International N.V. was used as a wire bonding apparatus. The wire bonding condition was ultrasonic wave frequency: 120 KHz, ultrasonic wave output time: 15 msec, ultrasonic output: 100 mW, bonding load: 20 gF, and search load: 15 gF. The height h (refer to FIG. 5) of the bonding wire from the surface of the semiconductor chip was about 60 μm.

Then, another semiconductor chip was die-bonded onto the semiconductor chip. That is, the die bond film that was produced in each example was pasted to the backside of another semiconductor chip at a temperature of 40° C. At this time, the pasting surface with the other semiconductor chip was the second adhesive layer. Next, the semiconductor chip was die-bonded onto the BGA substrate under a condition of a die bonding temperature of 150° C., a bonding pressure of 0.1 MPa, and a bonding time of 3 seconds. The pasting surface with the BGA substrate at this time was the first adhesive layer. The semiconductor chip and the other semiconductor chip had a chip size of 5 mm×5 mm and a thickness of 100 μm. After die bonding, a heat treatment at 120° C. for 8 hours was performed using a dryer. With this operation, the die bond film was thermally cured.

After that, the cross section was observed with a SEM to confirm whether the bonding wire was in contact with the backside of the other semiconductor chip or not. The evaluation was performed by defining the case where the bonding wire was not in contact with the other semiconductor chip as good, and the case where the bonding wire was in contact with the other semiconductor chip as poor. The results are shown in Tables 1 to 4.

(Evaluation of Burying of the Bonding Wire)

As for the evaluation of burying of the bonding wire in the first adhesive layer, the semiconductor chip was die-bonded onto the BGA substrate, and then another semiconductor chip was die-bonded onto the semiconductor chip using the die bond film that was manufactured in each example by the same method as that used when the contact evaluation of the bonding wire was performed. After that, the die bond film was thermally cured by performing a heat treatment at 120° C. for 8 hours.

Then, the cross section was observed with a SEM to confirm whether the bonding wire was buried in the first adhesive layer or not. The evaluation was performed by defining the case where the bonding wire was buried in the first adhesive layer without generating voids as good, and the cases where the bonding wire and the first adhesive layer were not in contact with each other and voids were generated as poor. The results are shown in Tables 1 to 4.

(The Pickup Property)

The die bond film that was manufactured in each example and a dicing film (trade name: V-12S manufactured by Nitto Denko Corporation) were pasted together so that the first adhesive layer in the die bond film and the pressure-sensitive adhesive layer in the dicing film serve as a pasting surface.

Then, a semiconductor wafer (8 inches in diameter, 200 μm in thickness) was pasted onto the second adhesive layer of the die bond film by press bonding with a roll at 40° C., and dicing was performed. The dicing was performed with full cut so that the chip size become 8 mm square.

Next, the evaluation of the pickup property was performed by picking up the semiconductor chip by a pushing up method using a needle from the base side of each dicing die bond film. Specifically, the success rate when continuously picking up 100 semiconductor chips under the following conditions is shown.

<Pasting Conditions>
Pasting apparatus: MA-3000II manufactured by Nitto Seiki Co., Ltd.
Pasting speed: 10 mm/min
Pasting pressure: 0.15 MPa
Stage temperature during pasting: 40° C.

<Dicing Conditions>
Dicing apparatus: DFD6361 manufactured by DISCO Corporation
Dicing ring: DTF2-8-1 manufactured by DISCO Corporation
Dicing speed: 50 mm/sec
Dicing blade: NBGZH-1030-27HCBB
Rotation speed of dicing blade: 45,000 rpm
Blade height: 0.085 mm
Cutting method: mode A/step cut
Chip size: 8 mm square <Pickup Conditions>
Die bond apparatus: manufactured by Shinkawa Ltd.
Number of needles: 9 needles
Needle pushing distance: 500 μm
Needle pushing speed: 5 mm/sec
Collet maintaining time: 1 second (Measurement of the Glass Transition Temperature (Tg))

The first adhesive layer or the second adhesive layer that was produced in each example was cut into a rectangular shape of 40 mm in length and 10 mm in width with a cutting knife. The tensile storage modulus and the loss modulus at −50 to 300° C. were measured under a condition of a frequency of 1 Hz and a temperature rise rate of 10° C./min using a solid viscoelasticity measurement apparatus (RSAIII manufactured by Rheometric Scientific FE, Ltd.). The glass transition temperature was obtained by reading a peak value of tan (δ) of the measurement data. The results are shown in Tables 5 to 6.

TABLE 1

|  | Example 1 | | Example 2 | | Example 3 | | Example 4 | | Example 5 | |
| --- | --- | --- | --- | --- | --- | --- | --- | --- | --- | --- |
|  | First adhesive layer | Second adhesive layer | First adhesive layer | Second adhesive layer | First adhesive layer | Second adhesive layer | First adhesive layer | Second adhesive layer | First adhesive layer | Second adhesive layer |
| X (parts by weight) | 951 | 20 | 255 | 36 | 145 | 98 | 951 | — | 101 | 20 |
| Y (parts by weight) | 100 | 100 | 100 | 100 | 100 | 100 | 100 | 100 | 100 | 100 |
| X/(X + Y) | 0.90 | 0.17 | 0.72 | 0.26 | 0.59 | 0.49 | 0.90 | — | 0.50 | 0.17 |
| Thickness (μm) | 60 | 10 | 60 | 10 | 60 | 10 | 60 | 10 | 60 | 10 |
| $d_1/(d_1 + d_2)$ | 0.86 | | 0.86 | | 0.86 | | 0.86 | | 0.86 | |
| Shear loss modulus G″ (Pa) at 120° C. before thermal curing | $5.5 \times 10^2$ | $8 \times 10^5$ | $5 \times 10^3$ | $5 \times 10^5$ | $1.15 \times 10^4$ | $2.2 \times 10^4$ | $5.5 \times 10^2$ | $9.5 \times 10^5$ | $2.1 \times 10^4$ | $8 \times 10^5$ |
| Tensile storage modulus (MPa) at 175° C. after thermal curing | 10 | | 8 | | 2 | | 12 | | 1 | |
| 180-Degree peeling strength | 12 | 5 | 8 | 6 | 7 | 7 | 12 | 0.2 | 7 | 5 |
| Contact with the bonding wire | good | | good | | good | | good | | good | |
| Burying of the bonding wire | good | | good | | good | | good | | poor | |
| Pickup property | good | | good | | good | | good | | good | |

TABLE 2

|  | Example 6 | | Example 7 | | Example 8 | | Example 9 | | Example 10 | |
| --- | --- | --- | --- | --- | --- | --- | --- | --- | --- | --- |
|  | First adhesive layer | Second adhesive layer | First adhesive layer | Second adhesive layer | First adhesive layer | Second adhesive layer | First adhesive layer | Second adhesive layer | First adhesive layer | Second adhesive layer |
| X (parts by weight) | 951 | 166 | 951 | 20 | 951 | 20 | 951 | 20 | 951 | 20 |
| Y (parts by weight) | 100 | 100 | 100 | 100 | 100 | 100 | 100 | 100 | 100 | 100 |
| X/(X + Y) | 0.90 | 0.62 | 0.90 | 0.17 | 0.90 | 0.17 | 0.90 | 0.17 | 0.90 | 0.17 |
| Thickness (μm) | 60 | 10 | 60 | 30 | 60 | 5 | 60 | 2 | 60 | 60 |
| $d_1/(d_1 + d_2)$ | 0.86 | | 0.67 | | 0.92 | | 0.97 | | 0.50 | |
| Shear loss modulus G'' (Pa) at 120° C. before thermal curing | $5.5 \times 10^2$ | $1.1 \times 10^4$ | $5.5 \times 10^2$ | $8 \times 10^5$ | $5.5 \times 10^2$ | $8 \times 10^5$ | $5.5 \times 10^2$ | $8 \times 10^5$ | $5.5 \times 10^2$ | $8 \times 10^5$ |
| Tensile storage modulus (MPa) at 175° C. after thermal curing | 9 | | 5 | | 12 | | 13 | | 2 | |
| 180-Degree peeling strength | 12 | 8 | 12 | 8 | 12 | 8 | 12 | 8 | 12 | 8 |
| Contact with the bonding wire | poor | | good | | good | | poor | | good | |
| Burying of the bonding wire | good | | good | | good | | good | | good | |
| Pickup property | good | | good | | good | | good | | poor | |

TABLE 3

|  | Example 11 | | Example 12 | | Example 13 | | Example 14 | | Example 15 | |
| --- | --- | --- | --- | --- | --- | --- | --- | --- | --- | --- |
|  | First adhesive layer | Second adhesive layer | First adhesive layer | Second adhesive layer | First adhesive layer | Second adhesive layer | First adhesive layer | Second adhesive layer | First adhesive layer | Second adhesive layer |
| X (parts by weight) | 951 | 20 | 951 | 20 | 951 | 20 | 951 | 20 | 951 | 20 |
| Y (parts by weight) | 100 | 100 | 100 | 100 | 100 | 100 | 100 | 100 | 100 | 100 |
| X/(X + Y) | 0.90 | 0.17 | 0.90 | 0.17 | 0.90 | 0.17 | 0.90 | 0.17 | 0.90 | 0.17 |
| Thickness (μm) | 60 | 10 | 60 | 10 | 60 | 10 | 60 | 10 | 60 | 10 |
| $d_1/(d_1 + d_2)$ | 0.86 | | 0.86 | | 0.86 | | 0.86 | | 0.86 | |
| Shear loss modulus G'' (Pa) at 120° C. before thermal curing | $5.5 \times 10^2$ | $8 \times 10^5$ | $5.5 \times 10^2$ | $8 \times 10^5$ | $5.5 \times 10^2$ | $8 \times 10^5$ | $5.5 \times 10^2$ | $8 \times 10^5$ | $5.5 \times 10^2$ | $8 \times 10^5$ |
| Tensile storage modulus (MPa) at 175° C. after thermal curing | 10 | | 10 | | 10 | | 10 | | 10 | |
| 180-Degree peeling strength | 12 | 5 | 12 | 5 | 12 | 5 | 12 | 5 | 12 | 5 |
| Contact with the bonding wire | good | | good | | good | | good | | good | |
| Burying of the bonding wire | good | | good | | good | | good | | good | |
| Pickup property | good | | good | | good | | good | | good | |

TABLE 4

|  | Example 16 | | Example 17 | | Example 18 | | Example 19 | | Example 20 | |
| --- | --- | --- | --- | --- | --- | --- | --- | --- | --- | --- |
|  | First adhesive layer | Second adhesive layer | First adhesive layer | Second adhesive layer | First adhesive layer | Second adhesive layer | First adhesive layer | Second adhesive layer | First adhesive layer | Second adhesive layer |
| X (parts by weight) | 951 | 20 | 951 | 20 | 951 | 20 | 951 | 20 | 951 | 20 |
| Y (parts by weight) | 100 | 100 | 100 | 100 | 100 | 100 | 100 | 100 | 100 | 100 |

TABLE 4-continued

|  | Example 16 | | Example 17 | | Example 18 | | Example 19 | | Example 20 | |
|---|---|---|---|---|---|---|---|---|---|---|
|  | First adhesive layer | Second adhesive layer | First adhesive layer | Second adhesive layer | First adhesive layer | Second adhesive layer | First adhesive layer | Second adhesive layer | First adhesive layer | Second adhesive layer |
| X/(X + Y) | 0.90 | 0.17 | 0.90 | 0.17 | 0.90 | 0.17 | 0.90 | 0.17 | 0.90 | 0.17 |
| Thickness (μm) | 60 | 10 | 60 | 10 | 60 | 10 | 60 | 10 | 60 | 10 |
| $d_1/(d_1 + d_2)$ | 0.86 | | 0.86 | | 0.86 | | 0.86 | | 0.86 | |
| Shear loss modulus G'' (Pa) at 120° C. before thermal curing | $5.5 \times 10^2$ | $8 \times 10^5$ | $5.5 \times 10^2$ | $8 \times 10^5$ | $5.5 \times 10^2$ | $8 \times 10^5$ | $5.5 \times 10^2$ | $8 \times 10^5$ | $5.5 \times 10^2$ | $8 \times 10^5$ |
| Tensile storage modulus (MPa) at 175° C. after thermal curing | 10 | | 10 | | 10 | | 10 | | 10 | |
| 180-Degree peeling strength | 12 | 5 | 12 | 5 | 12 | 5 | 12 | 5 | 12 | 5 |
| Contact with the bonding wire | good | | good | | good | | good | | good | |
| Burying of the bonding wire | good | | good | | good | | good | | good | |
| Pickup property | good | | good | | good | | good | | good | |

TABLE 5

|  | Example 11 | Example 12 | Example 13 | Example 14 | Example 15 |
|---|---|---|---|---|---|
| Kind of dye or pigment | Dye + silica filler | Dye + silica filler | Dye + silica filler | Dye + silica filler | Carbon |
| Color of coloring layer | Red | Blue | Yellow | Green | Black |
| Content of metal ions | <100 ppm | <100 ppm | <100 ppm | <100 ppm | <100 ppm |
| Discrimination property of front and back | good | good | good | good | good |
| Color discrimination | good | good | good | good | good |
| Melt viscosity (pa · s) of the first adhesive layer | 500-600 | 500-600 | 500-600 | 500-600 | 500-600 |
| Tg (° C.) of the second adhesive layer | 35-45 | 35-45 | 35-45 | 35-45 | 35-45 |

TABLE 6

|  | Example 16 | Example 17 | Example 18 | Example 19 | Example 20 |
|---|---|---|---|---|---|
| Kind of dye or pigment | Alumina | Nickel filler | Copper filler | Titanium oxide filler | None |
| Color of coloring layer | White | Gray | Brown | White | Transparent |
| Content of metal ions | >100 ppm | >100 ppm | >100 ppm | >100 ppm | <100 ppm |
| Discrimination property of front and back | good | good | good | poor | poor |
| Color discrimination | good | good | good | good | poor |
| Melt viscosity (pa · s) of the first adhesive layer | 500-600 | 500-600 | 500-600 | 500-600 | 500-600 |
| Tg (° C.) of the second adhesive layer | 35-45 | 35-45 | 35-45 | 35-45 | 35-45 |

What is claimed is:

1. A die bond film for adhering, onto a semiconductor element that is electrically connected to an adherend with a bonding wire, another semiconductor element, wherein
at least a first adhesive layer that enables a portion of the bonding wire to pass through inside thereof by burying the portion upon press bonding and a second adhesive layer that prevents the other semiconductor element from contacting with the bonding wire are laminated,.
wherein the content of metal ions in the first adhesive layer is 100 ppm or less.

2. The die bond film according to claim 1, wherein each of the first adhesive layer and the second adhesive layer is formed from at least an epoxy resin, a phenol resin, and an acrylic resin, wherein
X/(X+Y) of the first adhesive layer, where the total weight of the epoxy resin and the phenol resin is X parts by weight and the weight of the acrylic resin is Y parts by weight, is in a range of 0.5 to 0.95, and X/(X+Y) of the second adhesive layer is in a range of 0.15 to less than 0.5.

3. The die bond film according to claim 1, wherein the total thickness of the die bond film is in a range of 40 to 120 μm, and $d_1/(d_1+d_2)$ is in a range of 0.6 to 0.95 where $d_1$ (μm) is the thickness of the first adhesive layer and $d_2$ (μm) is the thickness of the second adhesive layer.

4. The die bond film according to claim 1, wherein the shear loss modulus G" of the first adhesive layer at 120° C. before thermal curing is in a range of $5\times10^2$ to $1.5\times10^4$ Pa, and the shear loss modulus G" of the second adhesive layer at 120° C. before thermal curing is in a range of $2\times10^4$ to $1\times10^6$ Pa.

5. The die bond film according to claim 1, wherein at least one of the second adhesive layer or other adhesive layers when providing the other adhesive layers on the second adhesive layer contains at least one of a dye or a pigment.

6. The die bond film according to claim 1, wherein the glass transition temperature of the first adhesive layer is 20 to 60° C., and the glass transition temperature of the second adhesive layer is 60° C. or less.

7. The die bond film according to claim 1, wherein the tensile storage modulus at 175° C. after thermal curing is in a range of 0.5 to 100 MPa.

8. A dicing die bond film comprising:
a dicing film in which at least a pressure-sensitive adhesive layer is provided on a base; and
the die bond film according to claim 1 that is provided on the pressure-sensitive adhesive layer.

9. A semiconductor device that is manufactured with the die bond film according to claim 1.

10. A semiconductor device that is manufactured with the dicing die bond film according to claim 8.

11. A die bond film comprising a first adhesive layer and a second adhesive layer; wherein
the first adhesive layer possesses a shear loss modulus G" sufficiently low to permit a portion of a semiconductor element bonding wire to pass through inside thereof by burying the portion upon press bonding the die bond film onto a semiconductor element, and the shear loss modulus G" is sufficiently high to prevent the first adhesive layer from spreading out upon press bonding the die bond film onto the semiconductor element, and
the second adhesive layer possesses a shear loss modulus G" greater than the shear loss modulus G" of the first adhesive layer.

12. A dicing die-bonding film comprising the die bond film of claim 11 and a pressure-sensitive adhesive layer attached on the first adhesive layer side of the die bond film.

13. A semiconductor device comprising a first semiconductor element, a second semiconductor element, and the die bond film according to claim 11.

14. The semiconductor device according to claim 13, wherein the first semiconductor element and the second semiconductor element are approximately the same size.

15. The semiconductor device according to claim 13, wherein the die bond film is approximately the same size as at least either the first semiconductor element or the second semiconductor element.

* * * * *